United States Patent
Schwarz

(10) Patent No.: US 12,278,318 B2
(45) Date of Patent: Apr. 15, 2025

(54) COMPONENT AND METHOD FOR PRODUCING A COMPONENT

(71) Applicant: OSRAM Opto Semiconductors GmbH, Regensburg (DE)

(72) Inventor: Thomas Schwarz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 478 days.

(21) Appl. No.: 17/626,082

(22) PCT Filed: Jun. 19, 2020

(86) PCT No.: PCT/EP2020/067159
§ 371 (c)(1),
(2) Date: Jan. 10, 2022

(87) PCT Pub. No.: WO2021/008813
PCT Pub. Date: Jan. 21, 2021

(65) Prior Publication Data
US 2022/0376152 A1    Nov. 24, 2022

(30) Foreign Application Priority Data
Jul. 17, 2019 (DE) .................... 10 2019 119 371.0

(51) Int. Cl.
*H01L 33/62* (2010.01)
*H01L 23/00* (2006.01)
(Continued)

(52) U.S. Cl.
CPC .............. *H01L 33/62* (2013.01); *H01L 24/24* (2013.01); *H01L 24/32* (2013.01); *H01L 24/73* (2013.01);
(Continued)

(58) Field of Classification Search
CPC ..... H01L 33/62; H01L 24/32; H01L 25/7053; H01L 2224/32245; H01L 24/73; H01L 2224/24051
See application file for complete search history.

(56) References Cited

U.S. PATENT DOCUMENTS 10,153,403 B2 * 12/2018 Naka ..................... H01L 33/486
2013/0009190 A1 1/2013 Memida
(Continued)

FOREIGN PATENT DOCUMENTS

DE 102013213073 A1 1/2015
DE 102014102184 A1 * 8/2015 ............. H01L 33/56
(Continued)

OTHER PUBLICATIONS

International Search Report for International Patent Application No. PCT/EP2020/067159, dated Sep. 22, 2020 (5 pages).

*Primary Examiner* — Walter H Swanson
*Assistant Examiner* — Jacob T Nelson
(74) *Attorney, Agent, or Firm* — ArentFox Schiff LLP

(57) ABSTRACT

A component comprising a structural element, a leadframe and a shaped body, in which component the structural element and the leadframe are enclosed at least in regions by the shaped body in lateral directions and the leadframe does not project beyond side faces of the shaped body. The leadframe has at least one first subregion and at least one second subregion which is laterally spaced apart from the first subregion, wherein the structural element is electrically conductively connected to the second subregion by a planar contact structure. Furthermore, the structural element is arranged, in plan view, on the first subregion and projects laterally beyond the first subregion at least in regions, so that the structural element and the first subregion form an anchoring structure at which the structural element and the (Continued)

Figure 1A:
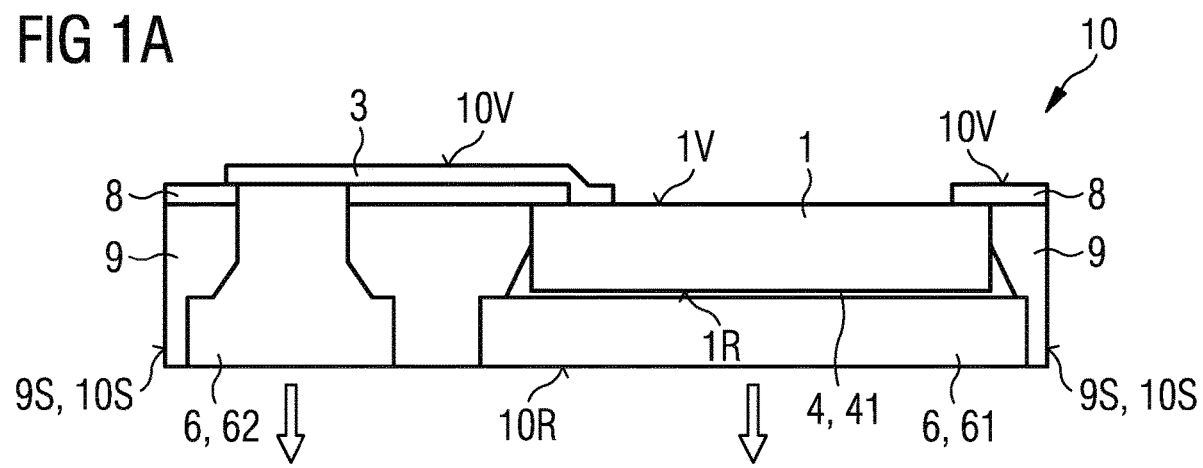

first subregion are anchored to the shaped body. Further specified is a method for producing such a component.

19 Claims, 12 Drawing Sheets

(51) Int. Cl.
    *H01L 25/075*     (2006.01)
    *H01L 33/54*     (2010.01)

(52) U.S. Cl.
    CPC .......... *H01L 24/92* (2013.01); *H01L 25/0753* (2013.01); *H01L 33/54* (2013.01); *H01L 2224/24051* (2013.01); *H01L 2224/24247* (2013.01); *H01L 2224/32013* (2013.01); *H01L 2224/32245* (2013.01); *H01L 2224/73267* (2013.01); *H01L 2224/92244* (2013.01); *H01L 2933/005* (2013.01); *H01L 2933/0066* (2013.01)

(56) References Cited

U.S. PATENT DOCUMENTS

| | | |
|---|---|---|
| 2013/0015577 A1 | 1/2013 | Pagaila |
| 2013/0200528 A1 | 8/2013 | Lin et al. |
| 2014/0138725 A1 | 5/2014 | Oyamada |
| 2016/0190399 A1* | 6/2016 | Abe ..................... H01L 23/3142 |
| | | 257/734 |
| 2016/0322343 A1 | 11/2016 | Scanlan |
| 2018/0240756 A1* | 8/2018 | Foo ..................... H01L 21/4857 |

FOREIGN PATENT DOCUMENTS

| | | | | |
|---|---|---|---|---|
| DE | 102014107964 A1 * | 12/2015 | ........... | H01L 33/486 |
| DE | 102014119390 A1 | 6/2016 | | |
| DE | 102015109876 A1 | 12/2016 | | |
| WO | 2015124609 A1 | 8/2015 | | |

* cited by examiner

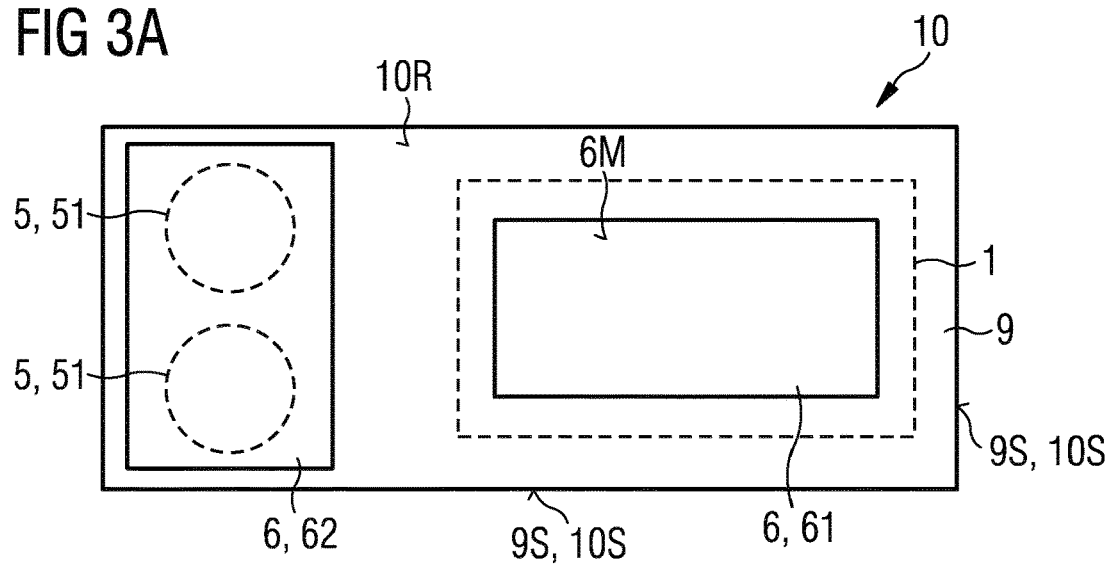
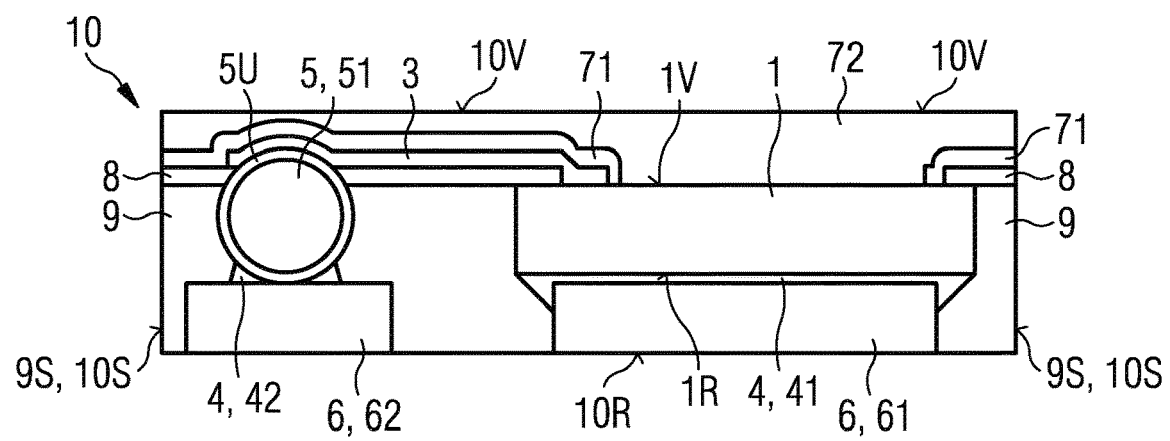
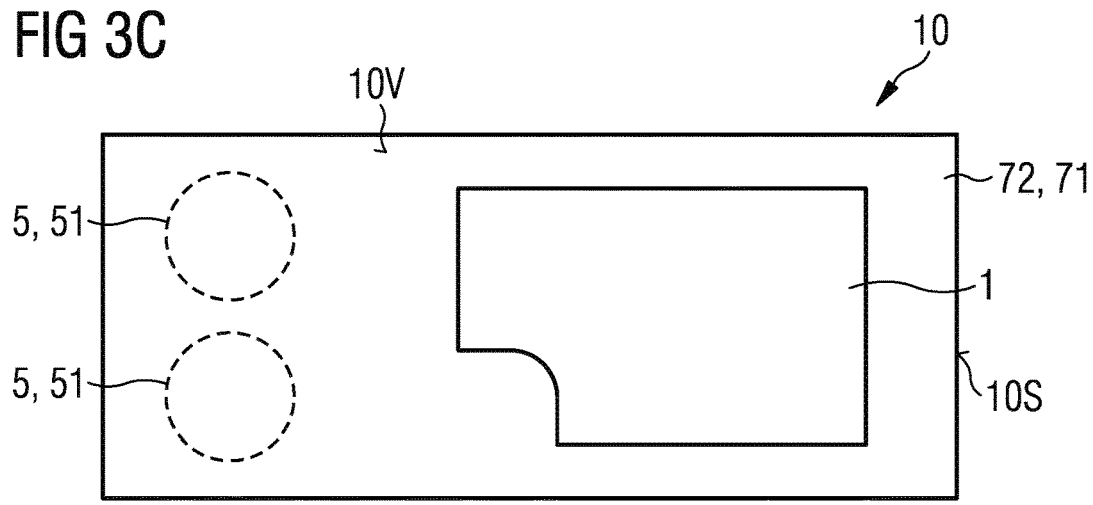

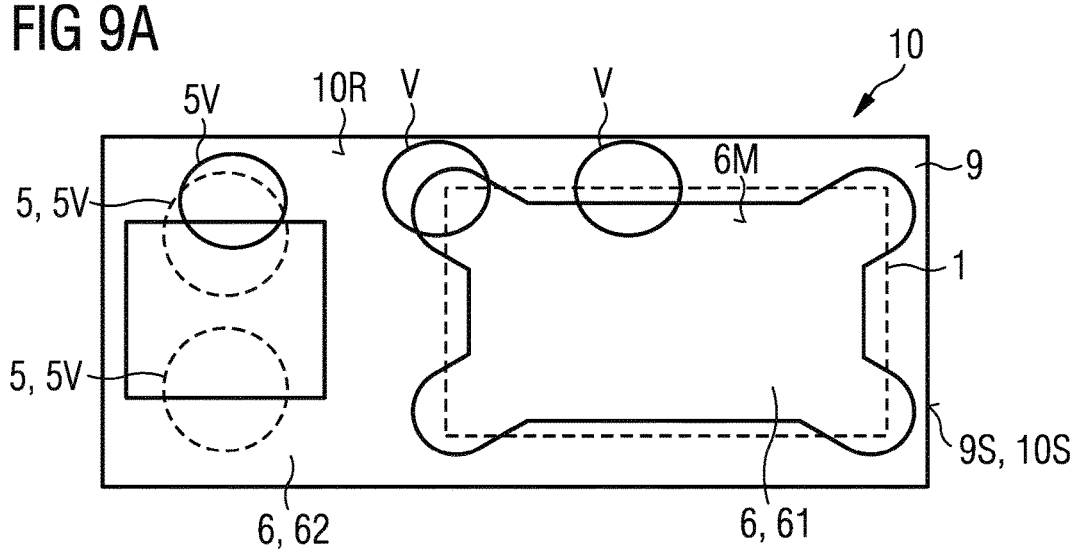
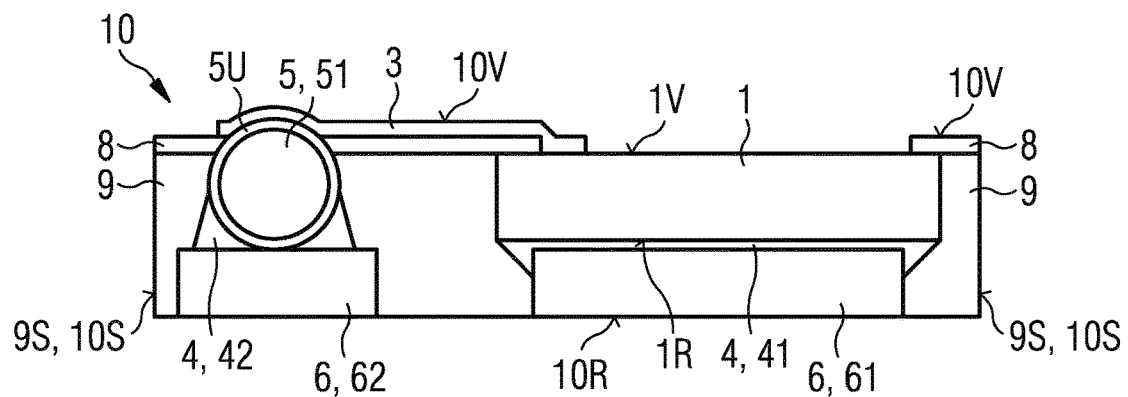
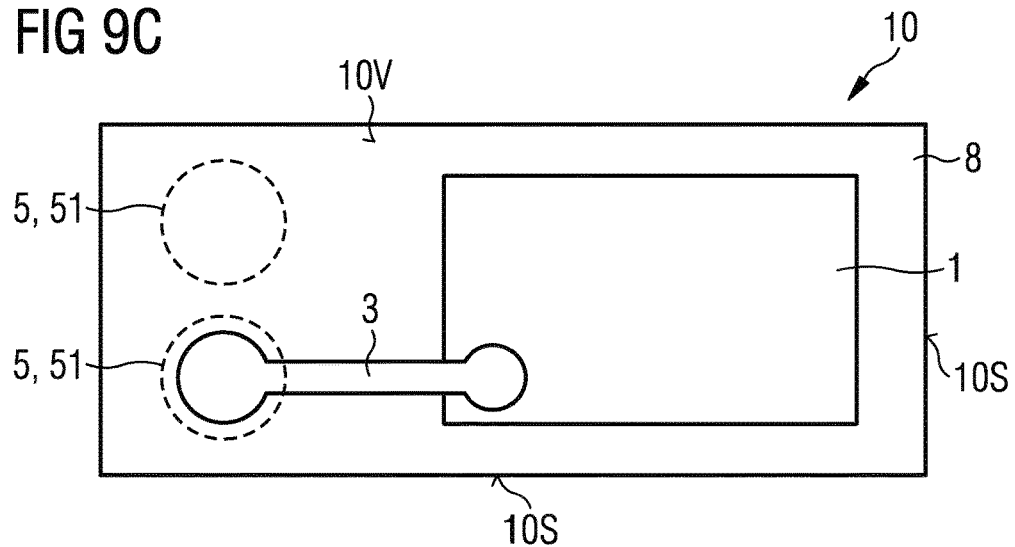

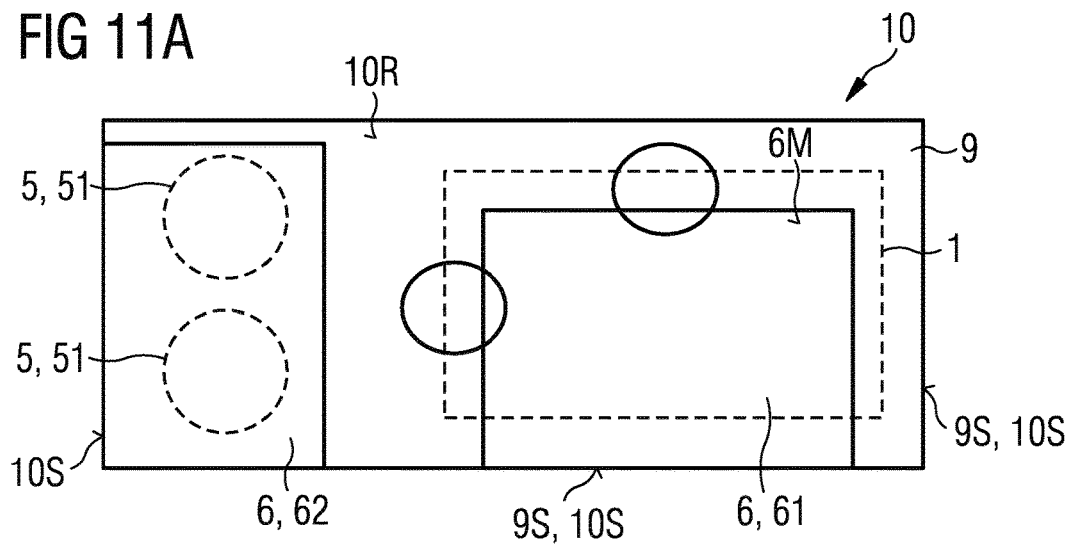
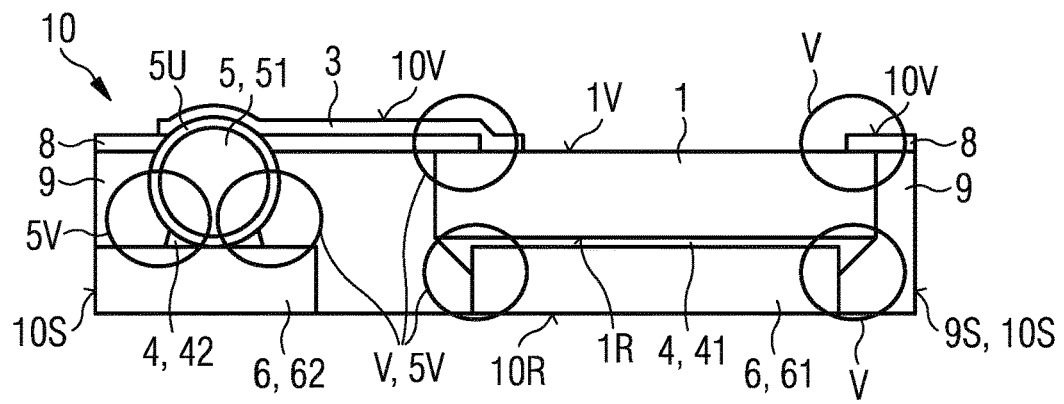
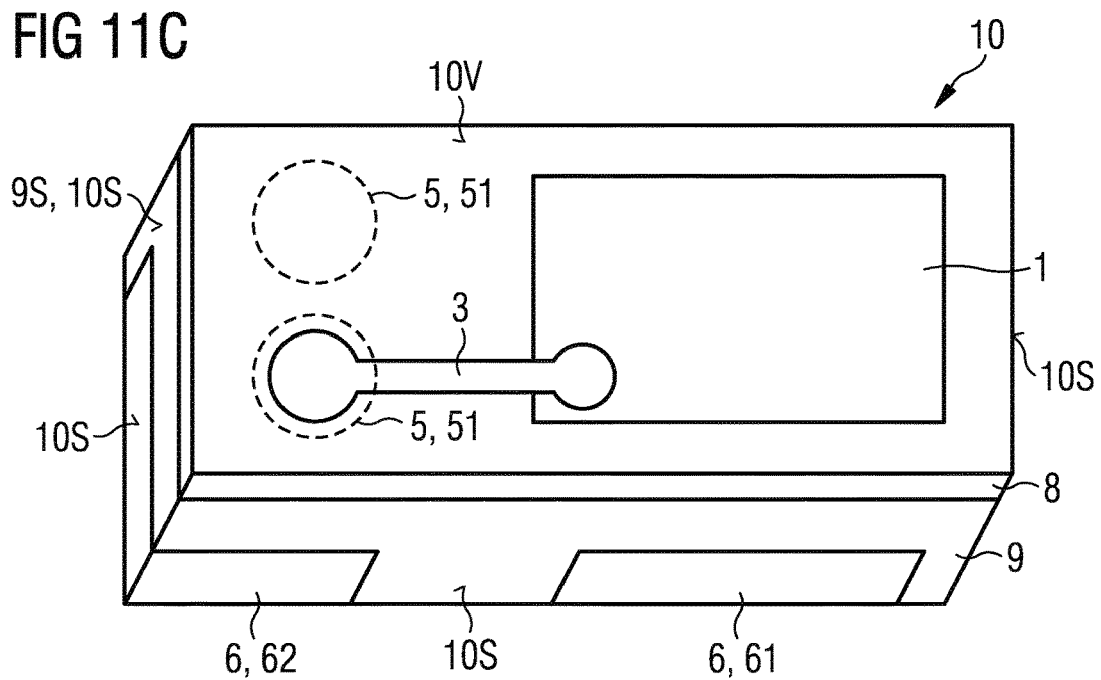

COMPONENT AND METHOD FOR PRODUCING A COMPONENT

This application is a 35 U.S.C. § 371 National Phase of PCT Application No. PCT/EP2020/067159, filed on Jun. 19, 2020, which claims priority to German Patent Application No. 10 2019 119 371.0, filed Jul. 17, 2019, the disclosures of each of which are hereby incorporated by reference herein in their entireties.

A device which has a component and a molded body is provided. A method for producing a device, in particular having a component and a molded body, is furthermore provided.

In a device having a molded body, a lead frame and a component, a planar connection for electrically contacting the component with the lead frame is often preferred. This, however, requires a surface which is as planar as possible for the wiring. Furthermore, an electrical contact should be fed through the molded body from an upper side of the component. One economical solution is to use a suitable lead frame. In such a device, however, the problem may arise in the course of time that some constituent parts of the device are detached from the other constituent parts of the device. When using a conventional etched lead frame, because of the relatively large etching radii of the lead frame, the device is often unnecessarily large and expensive since the device costs depend very greatly on the device area in the case of such a planar connection.

It is an object to provide a compact and more simply producible device, in particular a compact and more simply producible optoelectronic device. It is a further object to provide an economical method for producing a device, in particular the device described here.

These objects are achieved by the device according to the independent claim and by the method for producing at least one device. The other claims relate to further configurations of the device or of the method for producing the device.

According to at least one embodiment of the device, it has a component, a lead frame and a molded body, the lead frame being enclosed in the lateral direction by the molded body. In particular, the lead frame does not protrude laterally beyond the molded body anywhere. It is, however, possible for the lead frame and the molded body to end flush with one another along the lateral direction. For example, the molded body has a side face on which the lead frame is accessible. It is possible for the molded body to have a plurality of such side faces, on which the lead frame is locally exposed. For example, the component is an optoelectronic component, which may be a radiation-emitting or radiation-detecting semiconductor chip. In particular, the component is a light-emitting diode (LED).

A lateral direction is intended to mean a direction which, in particular, runs parallel to a main extent surface of the molded body or parallel to a mounting surface of the lead frame. A vertical direction is intended to mean a direction which, in particular, is directed perpendicularly to the main extent surface of the molded body or to the mounting surface of the lead frame. The vertical direction of the lateral direction are, in particular, mutually orthogonal.

According to at least one embodiment of the device, it has a planar contact structure. The planar contact structure extends, for example, from a front side of the component over a front side of the molded body to a contact point of the lead frame. In particular, the planar contact structure is located entirely on the front side of the component. The planar contact structure may be in direct electrical contact with the component and/or with the lead frame.

In particular, the planar contact structure is separated only by a single insulation layer from the molded body. In plan view, the planar contact structure may locally cover the component, the molded body and the lead frame. The planar contact structure is in particular configured as a thin, flatly formed and electrically conductive layer, for example as a planar metal layer. For example, the planar contact structure has, within the scope of production tolerances, no vertical elevations or vertical depressions which are for example larger than 50 µm, for instance larger than 40 µm, 30 µm, 20 µm or larger than 10 µm.

On the front side, the device is in particular free of any wire contacting, for example in the form of a bond wire. Because of the planar contacting, the component and the molded body may end flush or substantially flush with one another about a vertical height. In particular, a front side of the component and a front side of the molded body form a planar surface. Along the vertical direction, the molded body therefore does not protrude, or does not substantially protrude, beyond the component, and vice versa. In particular, the planar contact structure is located on the insulation layer, which may serve as a planarization layer of the device.

According to at least one embodiment of the device, it has at least one anchoring structure or a plurality of anchoring structures, on which the molded body is anchored. The anchoring structure may be formed by an indentation, for instance in the form of a recess, or by a protuberance, for instance in the form of a projection. As an alternative or in addition, it is possible that the device has an anchoring structure in the form of a step. For example, the component is arranged on the lead frame in such a way that the component protrudes laterally beyond the lead frame and thus has a lateral overhang beyond the lead frame. The component and the lead frame may therefore form an anchoring structure, particularly in the form of a step, on which the molded body is anchored.

During the anchoring of the molded body, the material of the molded body may engage in an anchoring structure or enclose surfaces of the anchoring structure, so as to prevent the molded body, the lead frame and/or the component being displaced or detached from one another along the vertical or lateral directions, for example in the event of external force actions or temperature changes. Preferably, the molded body and the lead frame are matched to one another in terms of their local geometry so that the molded body and the lead frame and/or the component make a form-fit connection. Manufacturing-related roughnesses on surfaces of the lead frame, which randomly occur within the scope of production tolerances and contribute insubstantially to the anchoring of the molded body, are not counted as part of the anchoring structure in the sense of the present application.

In at least one embodiment of the device, it has a component, a lead frame and a molded body. The component and the lead frame are at least locally enclosed in lateral directions by the molded body, the lead frame not protruding beyond side faces of the molded body. The lead frame has at least one first subregion and at least one second subregion laterally separated from the first subregion, the component being electrically conductively connected by means of a planar contact structure to the second subregion. In plan view, the component is arranged on the first subregion and laterally protrudes at least locally beyond the first subregion, so that the component and the first subregion form an anchoring structure on which the molded body is anchored with the component and the first subregion. It is possible for the lead frame to have a single first subregion or a plurality of first subregions and/or a single second subregion or a plurality of second subregions. In particular, the first subregions and/or the second subregions are at least partially enclosed by the molded body in the lateral direction.

By the anchoring on the molded body, position displacement or detachment of the component or of the lead frame, particularly in the direction of the backside of the device, may be prevented. The component may be a semiconductor chip, in particular a light-emitting semiconductor chip. Because of the planar contacting of the component on the front side of the device, the device may be configured as a QFN device in which, in particular, the lead frame does not protrude laterally from the molded body. This increases the compactness of the device and furthermore the packing density of the devices, for instance on a common circuit board, since the devices may in particular be externally electrically contacted via their backsides and optionally via their side faces.

According to at least one embodiment of the device, the first subregion is laterally separated from the second subregion by an intermediate region, the component partially covering the intermediate region in plan view. The intermediate region may be filled, in particular entirely filled, by a material of the molded body. The intermediate region is therefore located in the lateral direction between the first subregion and the second subregion of the lead frame. In plan view, the component has a lateral overhang in relation to the underlying first subregion. In particular, the lateral overhang of the component is located in the region of the intermediate region. A lateral distance between the component and the second subregion of the lead frame may thus be reduced.

For example, the lateral overhang is at least 1 µm, 2 µm, 5 µm or at least 10 µm. In order to reduce a risk of fracture, particularly during the formation of the molded body, the overhang may be less than 60%, 50% or less than 40% of the vertical layer thickness of the component.

According to at least one embodiment of the device, the planar contact structure is located on a front side of the component. The component may be electrically conductively connected by means of its backside to the first subregion. The planar contact structure is configured particularly in the form of a planar lead structure, for example in the form of a planar metal layer, for instance a copper layer. The planar contact structure is in particular contacting without a wire bond connection.

According to at least one embodiment of the device, the first subregion and the second subregion of the lead frame are formed from the same material. For example, the subregions of the lead frame are formed from a metal, for instance copper. As a variant thereof, it is possible for the subregions of the lead frame to be formed from different materials. In particular, the first subregion and the second subregion are assigned to different electrical polarities of the device.

According to at least one embodiment of the device, the lead frame has a smaller vertical height than the molded body. The planar contact structure may be electrically conductively connected by means of an intermediate contact to the second subregion of the lead frame. The intermediate contact may be different to the lead frame or part of the second subregion of the lead frame. For example, the intermediate contact is laterally surrounded, in particular entirely, by the molded body.

The planar contacting generally requires a surface which is as planar as possible for the wiring. In order to achieve planar contacting reliably at a distance which is as small as possible from the component or from the molded body, the molded body may be provided with an insulation layer. The insulation layer may locally cover the component. In particular, the insulation layer serves as a planarization layer, the planar contact structure being arranged indirectly or directly on the insulation layer. The insulation layer may be formed from a dielectric. In particular, the insulation layer has an opening in which the radiation entry or radiation exit face of the component is exposed, that is to say not covered by the insulation layer.

According to at least one embodiment of the device, the intermediate contact is fastened, for example adhesively bonded or soldered, on the second subregion. For example, the intermediate contact has the shape of a sphere. Because of the geometry of the intermediate contact, lateral indentations on which the molded body is anchored, in particular anchored bilaterally, can be formed at transition regions between the intermediate contact and the second subregion. Displacement of the position of the second subregion relative to the molded body may then be prevented in both vertical directions. As a variant thereof, it is possible for the intermediate contact to have any desired geometry, the intermediate contact locally protruding laterally beyond the second subregion in a plan view of the second subregion of the lead frame.

According to at least one embodiment of the device, the intermediate contact has a spherical core, in particular made of a metal, for instance copper. The spherical core may be coated with an electrically conductive encapsulation. The electrically conductive encapsulation may be formed from nickel or a noble metal. The intermediate contact, particularly in a spherical shape, has a total height which is for example between 100 µm and 300 µm, inclusive, for instance between 200 µm and 260 µm, inclusive.

As an alternative or in addition, it is possible for the intermediate contact to be a passive chip, which is for instance fastened on the second subregion and establishes an electrical connection between the planar contact structure and the second subregion. The molded body is in particular anchored on the passive chip by the passive chip having a lateral indentation or a lateral protuberance, or in plan view for example locally protruding beyond the second subregion of the lead frame.

According to at least one embodiment of the device, the second subregion of the lead frame extends along the vertical direction through the molded body. In particular, the lead frame, for instance the second subregion of the lead frame, has at least one lateral indentation or lateral protuberance, on which the molded body is anchored. The second subregion has a cross section, the size of which in particular varies along the vertical direction. For example, the second subregion has, at a vertical height between the front side and the back side of the device, a cross section which is smaller or larger than the cross section of the second subregion on the front side and/or on the back side of the device. The second subregion therefore has an anchoring structure in the form of an indentation or a protuberance, so that the second subregion of the lead frame and the molded body can make a form-fit connection.

According to at least one embodiment of the device, the lead frame ends flush in lateral directions with at least one of the side faces of the molded body. In this case, the first subregion and/or the second subregion of the lead frame may end flush on a side face or on a plurality of side faces, in particular on all side faces of the molded body. On at least one of the side faces or on a plurality of side faces of the molded body, the lead frame therefore has at least one exposed surface or a plurality of exposed surfaces, which may be externally accessible. The exposed surfaces of the lead frame on the side faces of the molded body may serve as electrical contact pads or as marking faces for a solder stop limit.

According to at least one embodiment of the device, the component has a front side facing away from the lead frame, in particular facing away from the first subregion of the lead frame, which is locally covered by the planar contact structure and by an insulation layer. Except for the planar contact structure or except for the planar contact structures, the front side is in particular free of further electrical terminals or free of further electrical connections. The planar contact structure and the insulation layer may in plan view likewise cover the molded body, so that the component is vertically anchored because of the partial coverage by the planar contact structure and by the insulation layer. Displacement of the position of the component in the direction of the front side may be prevented because of the coverage of the front side of the component by the insulation layer and the planar contact structure.

According to at least one embodiment of the device, the first subregion or the second subregion of the lead frame have a first cross section on a back side of the device and a second cross section between the back side and a front side of the device. In particular, the first cross section is smaller than the second cross section. For example, the first cross section transitions abruptly along the vertical direction, i.e. not continuously, into the second cross section, so that side faces of the lead frame have at least one step on which the molded body is anchored. A form-fit connection may thus be made between the molded body and the lead frame.

According to at least one embodiment of the device, the first subregion has a mounting face, the mounting face being configured in a structured fashion at its corners so that the device in plan view laterally protrudes beyond the mounting face at the structured corners or on the side lines of the mounting face. The mounting face of the first subregion is in particular a terminal face, on which the component or a multiplicity of components are arranged.

Overall, the terminal face may in plan view be configured to be smaller than the component. This configuration of the terminal face ensures that the component arranged thereon in any event locally protrudes laterally beyond the terminal face. As an alternative, it is also possible that although the terminal face is configured to be larger overall than the component, the component is nevertheless arranged on the terminal face in such a way that it protrudes beyond the terminal face at least on one side edge or at least at one corner of the terminal face. It is, for example, possible for the terminal face to be smaller or larger than the component only at the corners. It is also possible for the terminal face to be smaller than the component on at least one side edge or on two opposite side edges or on all side edges. In plan view, the terminal face and the component are in particular not congruent. Furthermore, the component in plan view is in particular not entirely located inside the terminal face.

According to at least one embodiment of the device, the second subregion has a terminal face on which the intermediate contact is arranged. Correspondingly, in a similar way to the terminal face of the first subregion and the component, the terminal face of the second subregion may be smaller than the intermediate contact. It is also possible for the terminal face of the second subregion to be smaller or larger than the intermediate contact only at the corners. Furthermore, it is possible for the terminal face of the second subregion to be smaller than the intermediate contact on at least one side edge or on two opposite side edges or on all side edges.

According to at least one embodiment of the device, it has a plurality of components which are arranged on at least one common first subregion of the lead frame. In particular, the first subregion has the shape of a torus. The components may in plan view respectively locally protrude laterally beyond the torus. The terminal face of the first common subregion has, for example, the shape of a donut pad. It is possible for the lead frame to have a plurality of first common subregions, a plurality of components being arranged on each of the first common subregions. The lead frame may have a multiplicity of spatially separated second subregions, which respectively are electrically conductively connected by means of a planar contact structure to one of the components. By means of the second subregions of the lead frame, the components may be driven in groups or individually.

In at least one embodiment of a method for producing a device having a component, a lead frame and a molded body, the lead frame is provided. The lead frame has, in particular, a first subregion and a second subregion laterally separated from the first subregion. The component is fastened on the first subregion so that the component in plan view laterally protrudes at least locally beyond the first subregion and thus forms an anchoring structure in the form of a step with the first subregion. The molded body is formed, the lead frame being enclosed at least locally by the molded body in lateral directions and not protruding beyond the side faces of the molded body. In particular, the molded body is anchored on the anchoring structure with the component and the first subregion. A planar contact structure is formed on the component and the molded body, the component being electrically conductively connected by means of the planar contact structure to the second subregion.

It is possible for the device to comprise a plurality of components. The components may be arranged on a common subregion or on different subregions of the lead frame. By means of such a method, a plurality of devices may furthermore be produced. For example, a plurality of components are arranged on the lead frame before the molded body is applied onto the lead frame, and in particular around the components. In order to form a multiplicity of devices, the lead frame and the molded body may be individualized. During the individualization of the devices, the molded body and the lead frame, in particular the first subregion of the lead frame or the second subregion of the lead frame, may be divided so that the individualized devices have at least one side face or a plurality of side faces, which are formed by surfaces of the individualized molded body and of the individualized lead frame. In this case, the molded body and the lead frame may end flush with one another on one side face or on a plurality of side faces of the device. The molded body and/or the lead frame may have cutting traces of an individualization process, in particular a mechanical individualization process, on at least one side face of the device.

According to at least one embodiment of the method, the molded body is applied on and around the lead frame by means of a casting method or a plastic forming method.

A casting method or a plastic forming method is generally intended to mean a method by which a molding compound, in this case the housing frame, is configured according to a predetermined shape, preferably with the action of pressure, and if necessary cured. In particular, the term "casting method" or "plastic forming method" includes at least dispensing, jetting, molding, injection molding, transfer molding and compression molding. The molded body is in particular formed from a plastic material, in particular from a casting material or from a castable material. In particular, the molded body is formed by means of a film-assisted molding method.

According to at least one embodiment of the method, a through-contact is fastened, for instance adhesively bonded or soldered, on the second subregion of the lead frame before the formation of the molded body, the through-contact being adapted on the one hand to establish an electrical connection between the second subregion and the planar contact structure and on the other hand to anchor the molded body. It is possible for the device to have additional anchoring structures, the additional anchoring structures being formed for instance by etching the lead frame. For the anchoring with the molded body, a ⅓-, ½- or ⅔-etched lead frame may be used. Because of the etching, the lead frame may have an anchoring structure for instance in the form of a step, which in particular faces toward the back side of the device.

According to at least one embodiment of the method, a plurality of components are arranged on a common first subregion and are overmolded by a common molded body. The common first subregion and the common molded body are divided in order to individualize the devices into a plurality of first subregions and a plurality of molded bodies, so that the first subregion and the molded body of the same device end flush at least on one side face of the device.

The method described here is particularly suitable for the production of a device as described here. The features described in connection with the device may therefore also be used for the method, and vice versa.

Figure 1B:
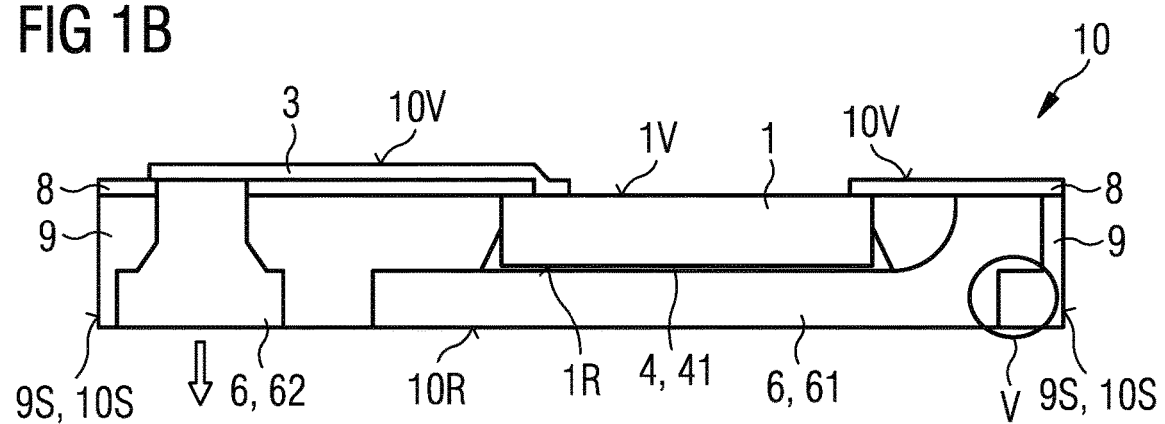
Figure 2A:
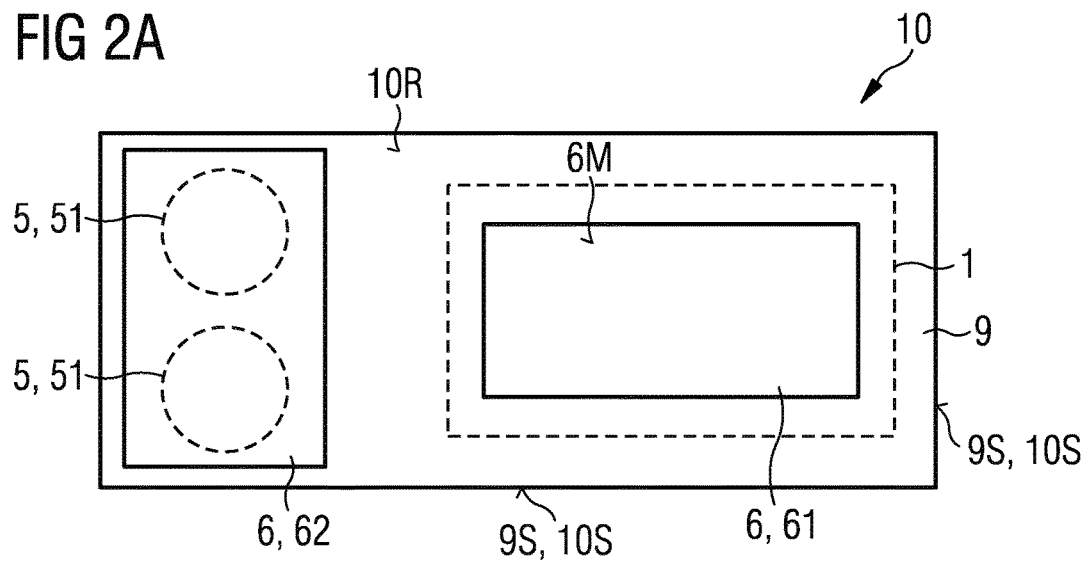
Figure 2B:
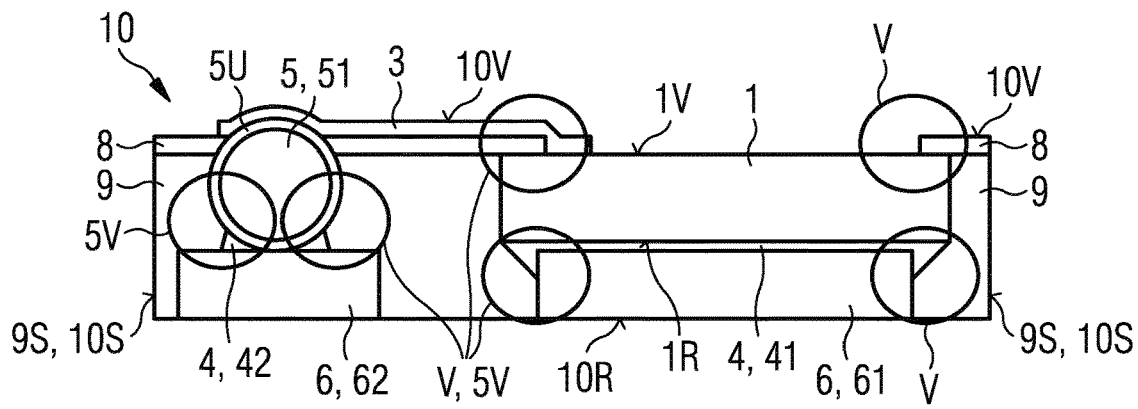
Figure 2C:
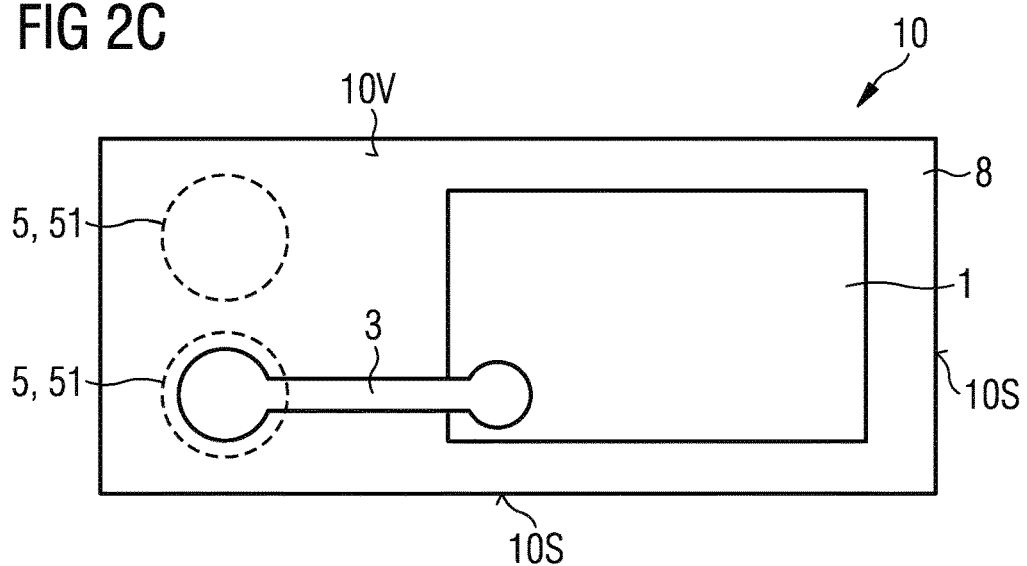

Further embodiments and refinements of the device, or of the method for producing the device, may be found from the following description in conjunction with the exemplary embodiments explained in FIGS. 1A to 12C, in which:

FIGS. 1A and 1B show schematic representations of various comparative examples of a device, FIGS. 2A, 2B and 2C show schematic representations of one exemplary embodiment of a device in a plan view of a back side of the device, in a sectional view and in a plan view of a front side of the device, FIGS. 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B and 10C show schematic representations of further exemplary embodiments of the device in a plan view of a back side of the device, in a sectional view and in a plan view of a front side of the device, and FIGS. 11A, 11B, 11C, 12A, 12B and 12C show schematic representations of further exemplary embodiments of the device in a plan view of a back side of the device, in a sectional view and in a plan view of a front side of the device.

Elements which are the same or of the same type, or which have the same effect, are provided with the same references in the figures. The figures are respectively schematic representations and therefore not necessarily true to scale. Rather, relatively small elements and in particular layer thicknesses may be represented exaggeratedly large for illustration.

A comparative example of a device 10 is represented schematically in a sectional view in FIG. 1A. The device 10 has a lead frame 6, a molded body 9 and a component 1. The lead frame 6 has a first subregion 61, on which the component 1 is arranged.

In particular, the component 1 is electrically and mechanically connected by means of a connecting layer 4, for instance by means of an electrically conductive first connecting layer 41, to the first subregion 61. The first connecting layer 41 may be a solder layer, a sinter layer or an adhesive layer with electrically conductive particles that are embedded therein. The lead frame 6 has a second subregion 62, which is separated in the lateral direction, in particular by an intermediate region, from the first subregion 61. In lateral directions, the first subregion 61 and the second subregion 62 are enclosed at least locally by the molded body 9. The intermediate region between the first subregion 61 and the second subregion 62 may be filled partially or entirely by a material of the molded body 9. The component 1 is in particular entirely enclosed in lateral directions by the molded body 9.

The component 1 has a front side 1V and a back side 1R facing away from the front side 1V, the back side 1R facing toward the first subregion 61 of the lead frame 6. Via the back side 1R, the component 1 may be electrically conductively connected by means of the electrically conductive first connecting layer 41 to the first subregion 61 of the lead frame 6. The first subregion 61 is in particular assigned to a first electrical polarity of the device 10. The second subregion 62 may be assigned to a second electrical polarity of the device 10, which is different to the first electrical polarity. As represented in FIG. 1A, the second subregion 62 extends along the vertical direction through the molded body 9, the second subregion 62 being electrically conductively connected by means of a contact structure 3, in particular by means of a planar contact structure 3, to the front side 1V of the component 1.

In the vertical direction, an insulation layer 8 is arranged between the molded body 9 and the contact structure 3. In plan view, the insulation layer 8 may cover the molded body 9 partially or entirely. In particular, the insulation layer 8 has at least one opening at which the contact structure 3 is electrically conductively connected to the second subregion 62 of the lead frame 6. In plan view, the insulation layer 8 may partially cover the front side 1V of the component 1. The contact structure 3 may directly adjoin the insulation layer 8. In plan view, the contact structure 3 may partially cover the front side 1V of the component 1.

A front side 10V of the device 10 may be formed locally by a surface of the contact structure 3 and locally by the front side 1V of the component 1. In particular, the front side 10V is a radiation exit face or radiation entry face of the device 10. A back side 10R of the device 10 may be formed locally by a surface of the molded body 9 and locally by surfaces of the first subregion 61 and of the second subregion 62 of the lead frame 6. The device 10 has side faces 10S, which in particular are formed by side faces 9S of the molded body 9. As a variant of FIG. 1A, it is possible for the side faces 10S to be formed locally by side faces of the lead frame 6, for instance by side faces of the first subregion 61 or by side faces of the second subregion 62. Both the first subregion 61 and the second subregion 62 may be electrically contacted on the back side 10R. The device 10 is therefore externally electrically contactable via the back side 10R and therefore configured as a surface-mountable device (SMD) 10.

As schematically represented in FIG. 1A, the component 1 in plan view is located in particular entirely inside the first subregion 61 of the lead frame 6. The second subregion 62 has a lateral cross section which decreases monotonically from the back side 10R in the direction of the front side 10V. With such a configuration of the device 10, it may happen under unfavorable conditions that the lead frame 6 and/or the component 1 become detached from the molded body 9. A possible displacement of the positions of the subregions 61 and 62 and of the component 1 is schematically represented by the downward arrows in FIG. 1A.

The further comparative example of a device 10 represented in FIG. 1B corresponds substantially to the comparative example represented in FIG. 1A. In a different way thereto, the lead frame 6 is configured for instance as an etched lead frame 6. In particular, the first subregion 61 of the lead frame 6 has an anchoring structure V facing toward the back side 10R, for instance in the form of a step, on which the molded body 9 is anchored. By the anchoring of the molded body 9 on such an anchoring structure V of the lead frame 6, displacement of the first subregion 61 in the direction of the back side 10R of the device 10 may be prevented.

Because of the relatively large etching radii, however, the second subregion 62 of the lead frame 6 according to FIG. 1B has a much larger cross section in comparison with the comparative example according to FIG. 1A. A lateral distance between the component 1 and the second subregion 62 of the lead frame 6 is also increased by using the etched lead frame 6. These differences from the comparative example according to FIG. 1A lead to the area of the front side 10V of the device 10 being increased. The ratio of the light-active front side 1V of the component 1 to the total front side 10V of the device 10 is therefore less, so that the efficiency of the device 10 is reduced. The production costs also increase because of the enlarged front side 10V of the device 10.

FIGS. 2A, 2B and 2C represent an exemplary embodiment of a device 10 respectively in a plan view of the back side 10R, in a sectional view and in a plan view of the front side 10V. The device 10 according to FIG. 2B corresponds substantially to the comparative example represented in FIG. 1A or 1B. In contrast thereto, the component 1 protrudes in plan view laterally beyond the first subregion 61 of the lead frame 6. Furthermore, the device 10 has an intermediate contact 5, particularly in the form of a through-contact, which electrically conductively connects the second subregion 62 of the lead frame 6 to the planar contact structure 3. Because of the lateral overhang of the component 1 beyond the first subregion 61 and because of the geometry of the intermediate contact 5 arranged on the second subregion 62, the device 10 has additional anchoring structures V and 5V, on which the molded body 9 may be anchored.

Since the component 1 protrudes laterally in the direction of the second subregion 62, or in the direction of the intermediate contact 5, beyond the first subregion 61, a lateral distance between the component 1 and the second subregion 62 or the intermediate contact 5 may be reduced. The ratio of the front side 1V of the component 1 to the total front side 10V of the device 10 may therefore be maximized. Because of the overhang of the component 1 beyond the first subregion 61, the component 1 and the first subregion 61 form an anchoring structure V in the form particularly of a step, on which the molded body 9 is anchored. This anchoring structure V is formed by the arrangement of two different constituent parts of the device 10, namely by the arrangement of the component 1 over the first subregion 61 of the lead frame 6. In a plan view of the back side 10R, the anchoring structure V may be covered, in particular entirely covered, by the component 1. Such an anchoring structure V prevents the first subregion 61 or the component 1 being detached from the molded body 9.

By the partial coverage of the front side 1V of the component 1 by the insulation layer 8 and/or the planar contact structure 3, the relative position of the component 1 with respect to the molded body 9 is fixed. As schematically represented in FIG. 2B, the partial coverage of the front side 1V and the anchoring of the molded body 9 on the overhang of the component 1 prevent a change in the relative position of component 1 or of the first subregion 61 with respect to the molded body 9. Overall, the component 1 is anchored bilaterally, i.e. in both vertical directions.

Since the intermediate contact 5 has differently large cross sections along the vertical direction, an anchoring structure 5V, particularly in the form of an indentation, for instance in the form of a circumferential indentation, is formed in a transition region between the intermediate contact 5 and the second subregion 62 of the lead frame 6. By means of a connecting layer 4, in particular a second connecting layer 42, the intermediate contact 5 may be fastened on the second subregion 62. The second connecting layer 42 is preferably configured to be electrically conductive. The second connecting layer 42 may be a solder layer, a sinter layer or an adhesive layer with electrically conductive particles embedded therein. As an alternative, it is possible for the second connecting layer 42 to be configured to be electrically insulating.

The intermediate contact 5 may have a core 51, in particular a spherical core 51, made of a metal such as copper. The core 51 may be provided with an encapsulation 5U, for instance of nickel.

In particular, the core 51 is entirely covered by the encapsulation 5U in all directions. By the fastening of the intermediate contact 5 on the second subregion 62 and by the anchoring of the molded body 9 on the anchoring structure 5V, the relative position of the second subregion 62 with respect to the molded body 9 is fixed, particularly in both vertical directions. A possible change in the position of the second subregion 62 along the vertical direction, which is indicated for instance in FIGS. 1A and 1B, may be prevented by the configuration of the intermediate contact 5.

In FIG. 2A, the positions of the subregions 61 and 62 of the lead frame 6 on the back side 10R are represented schematically. Furthermore, the positions of the component 1 and of the intermediate contacts 5 on the subregions 61 and 62 are represented. In plan view, the component 1 may protrude laterally beyond the first subregion 61, at least along one lateral direction or along a plurality of lateral directions. As represented in FIG. 2A, the component 1 in plan view partially covers an intermediate region located between the subregions 61 and 62. The first subregion 61 has a mounting face 6M, which in particular is entirely covered by the component 1.

According to FIG. 2A, the component 1 may have a larger cross section than the first subregion 61. In plan view, the component 1 may entirely cover the first subregion 61. In particular, the component 1 may protrude laterally beyond at least two or three, four, or beyond precisely four, side faces of the first subregion 61.

The device 10 has two intermediate contacts 5, which in plan view are arranged entirely inside the second subregion 62. The exposed surfaces of the subregions 61 and 62 on the back side 10R serve in particular as contact pads of the device 10. In a plan view of the back side 10R, the exposed surfaces of the subregions 61 and 62 may be entirely surrounded by the molded body 9.

FIG. 2C schematically represents the device 10 in a plan view of its front side 10V. The planar contact structure 3 is located exclusively on the front side 10V of the device 10 and establishes an electrical connection between the front side 1V of the component 1 and one of the intermediate contacts 5. The other of the intermediate contacts 5 may be entirely covered by the insulation layer 8 and is therefore not electrically conductively connected directly to the planar contact structure 3. The intermediate contacts 5 are arranged, in particular symmetrically, on the second subregion 62. This on the one hand increases the mechanical stability of the device 10 and on the other hand simplifies the formation of the molded body 9 in respect of uniform pressure distribution.

The device 10 represented in FIGS. 2A, 2B and 2C and in the following FIGS. 3A to 12C is configured in particular as a QFN (quad flat no-lead) device. In particular, the device 10 does not have any electrical terminals or pins which protrude laterally beyond the molded body 9. This does not, however, rule out the subregions 61 and 62 locally ending flush with side faces 9S of the molded body 9 (FIGS. 11A to 12C). The electrical terminals are preferably configured in the form of planar contact pads on the back side 10R. In this way, the space required on a target area may be reduced and a high packing density of the devices 10 may be achieved.

The exemplary embodiment of a device 10 as represented in FIGS. 3A, 3B and 3C corresponds substantially to the exemplary embodiment represented in FIGS. 2A, 2B and 2C. In contrast thereto, the device 10 has a first cover layer 71, which is in particular configured to be radiation-opaque, for instance radiation-absorbent. In a plan view of the front side 10V, the first cover layer 71 may cover the planar contact structure 3 and the insulation layer 8 entirely and the component 1 partially. Such a cover layer 71 increases the contrast of a light-emitting device 10.

According to FIG. 3B, the device 10 has a second cover layer 72. The second cover layer 72 is in particular configured to be radiation-transmissive, for instance transparent for the radiation emitted by the component 1 during operation of the device 10. In plan view, the second cover layer 72 may cover the component 1 and the first cover layer 71 entirely. In particular, the second cover layer 72 serves as a protective layer of the device 10. The front side 10V may be formed exclusively by the surface of the second cover layer 72.

Figure 4A:
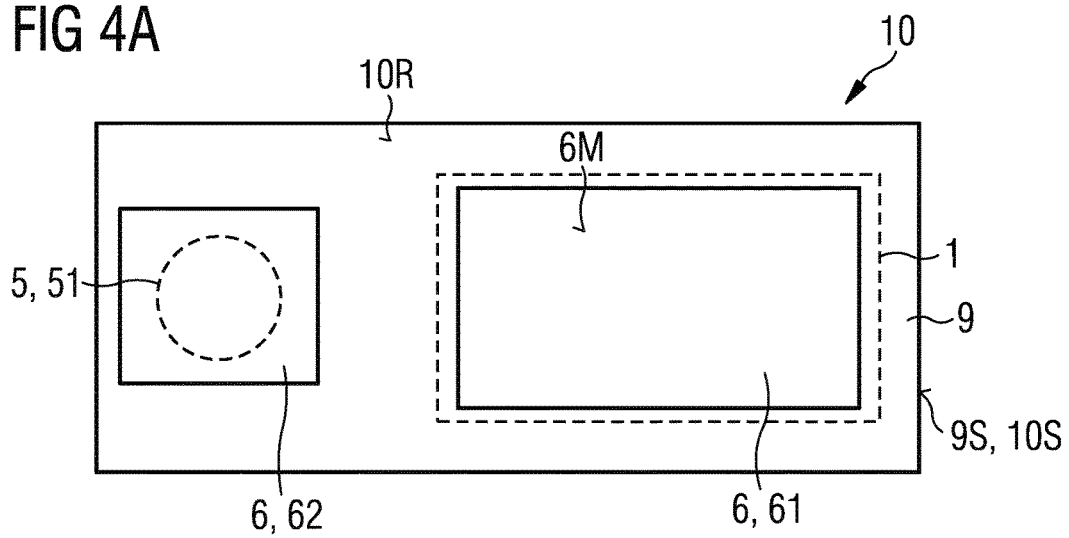
Figure 4B:
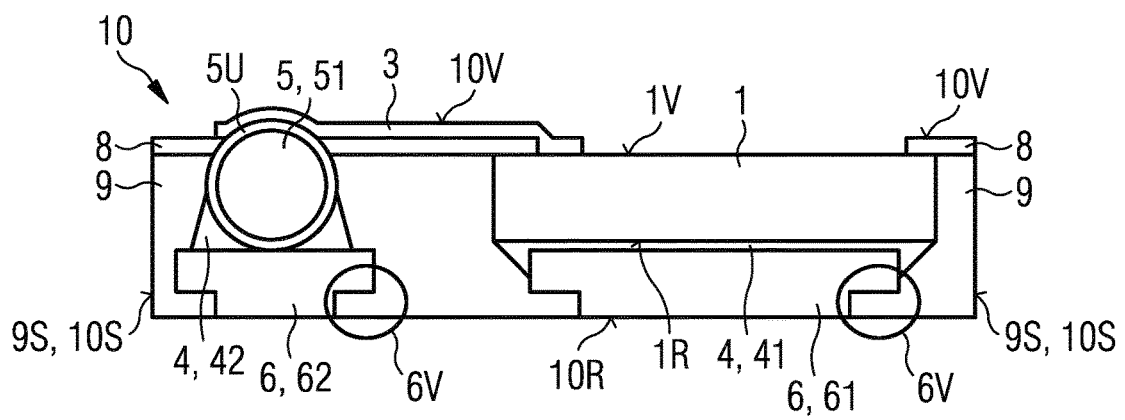
Figure 4C:
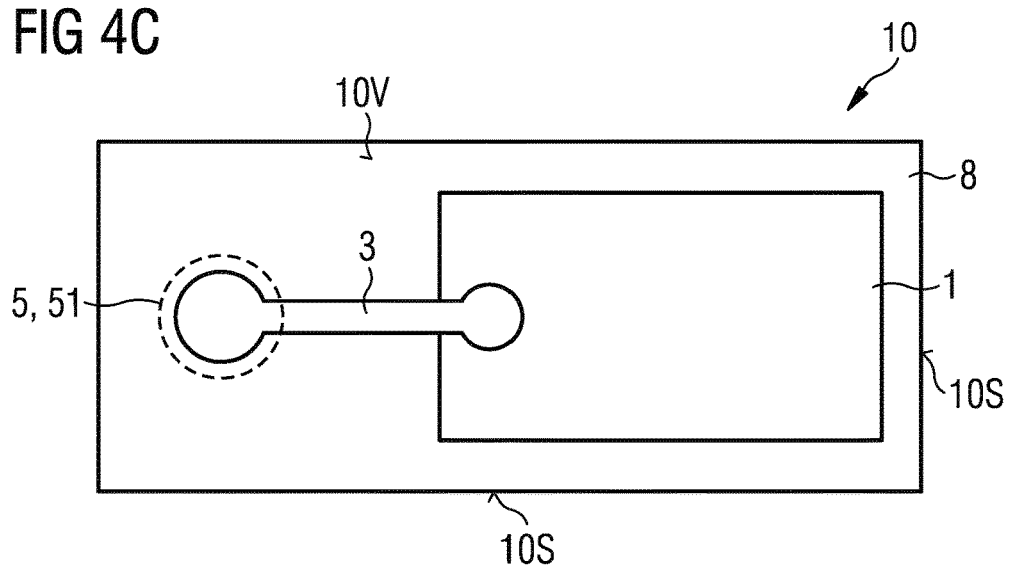

The exemplary embodiment of a device 10 as represented in FIGS. 4A, 4B and 4C corresponds substantially to the exemplary embodiment represented in FIGS. 2A, 2B and 2C. As a difference therefrom, the device 10 has a single intermediate contact 5. The single intermediate contact 5 is arranged, in particular symmetrically, on the second subregion 62 of the lead frame 6. The planar contact structure 3, which electrically conductively connects the intermediate contact 5 to the front side 1V of the component 1, is in arranged, particular likewise symmetrically, in the intermediate region between the subregions 61 and 62. The terminal point of the planar contact structure 3 is located not laterally as represented in FIG. 2C, but approximately centrally in the vicinity of a side edge of the front side 1V of the component 1.

As a further difference, the lead frame 6 has additional anchoring structures 6V. The additional anchoring structures 6V may be formed by partial etching of the lead frame 6. In particular, the additional anchoring structures 6V are respectively configured in the form of a step which faces toward the back side 10R. Unlike in FIG. 1B, in which the anchoring structure V is arranged laterally of the component 1, these additional anchoring structures 6V are located directly below the component 1 or the intermediate contact 5. In plan view, the intermediate contact 5 or the component 1 thus overlaps with the associated anchoring structure 6V. In order to form the step or the steps, for example at least 30%, 50% or 60% of the vertical layer thickness of the first subregion 61 and/or of the second subregion 62 are locally etched. With such a configuration of the lead frame 6, the anchoring of the molded body 9 is additionally increased.

Figure 5A:
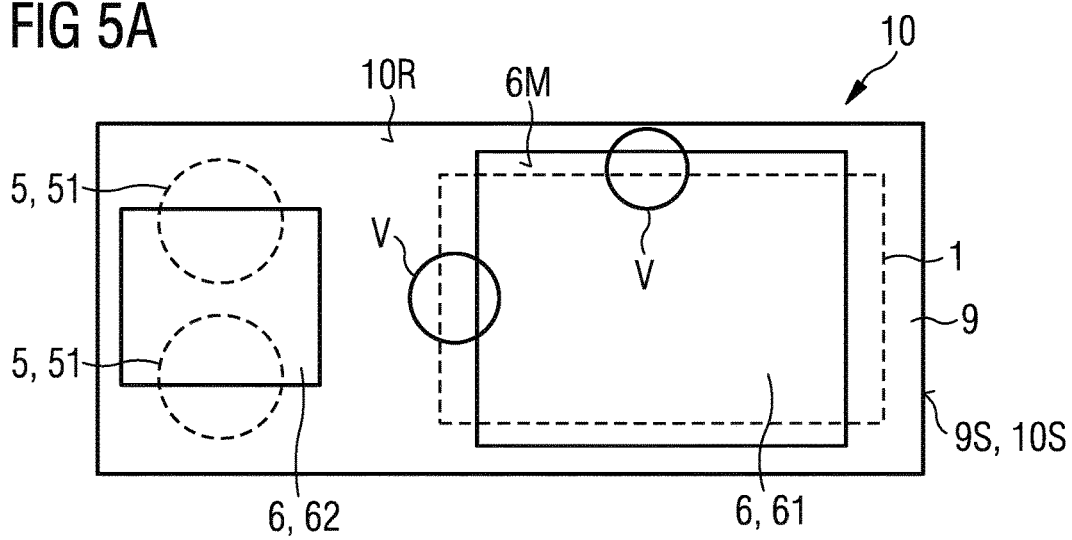
Figure 5B:
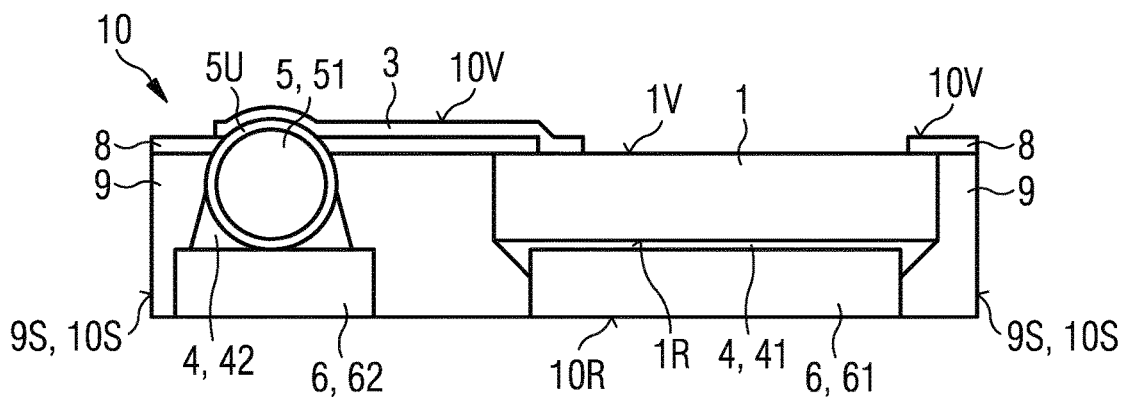
Figure 5C:
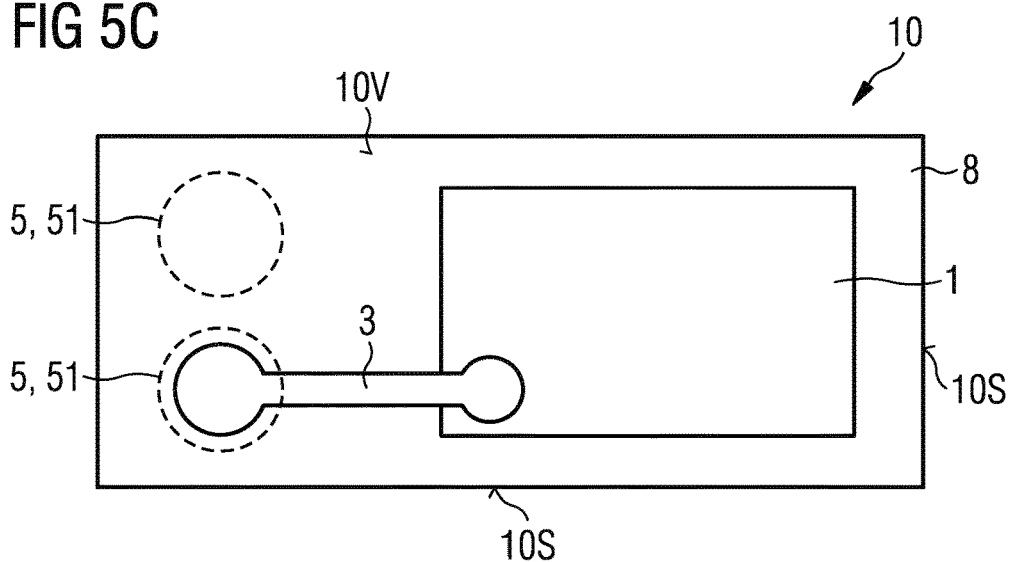

The exemplary embodiment of a device 10 as represented in FIGS. 5A, 5B and 5C corresponds substantially to the exemplary embodiment represented in FIGS. 2A, 2B and 2C. As a difference therefrom, the component 1 protrudes laterally beyond the first subregion 61 on two opposite side edges of the first subregion 61. On the other two opposite side edges of the first subregion 61, the component 1 in plan view is located inside the first subregion 61, in which case the first subregion 61 may locally protrude laterally beyond the component 1 at these points. The component 1 and the first subregion 61 therefore form not only steps which face toward the back side 10R of the device 10 but also steps which face toward the front side 10V of the device 10. Such a configuration of the component 1 and of the first subregion 61 allows bilateral anchoring of the molded body 9, namely in both vertical directions, so that the anchoring of the molded body 9 on the component 1 and the first subregion 61 is strengthened.

As a further difference from FIGS. 2A, 2B and 2C, the second subregion 62 is dimensioned in such a way that the intermediate contacts 5 locally protrude laterally beyond the second subregion 62. The intermediate contacts 5 are furthermore arranged in order to achieve a uniform pressure distribution and therefore symmetrically on the second subregion 62. At least one of the intermediate contacts 5 is electrically conductively connected to a planar contact structure 3 not directly, but at most indirectly by means of the second subregion 62.

Figure 6A:
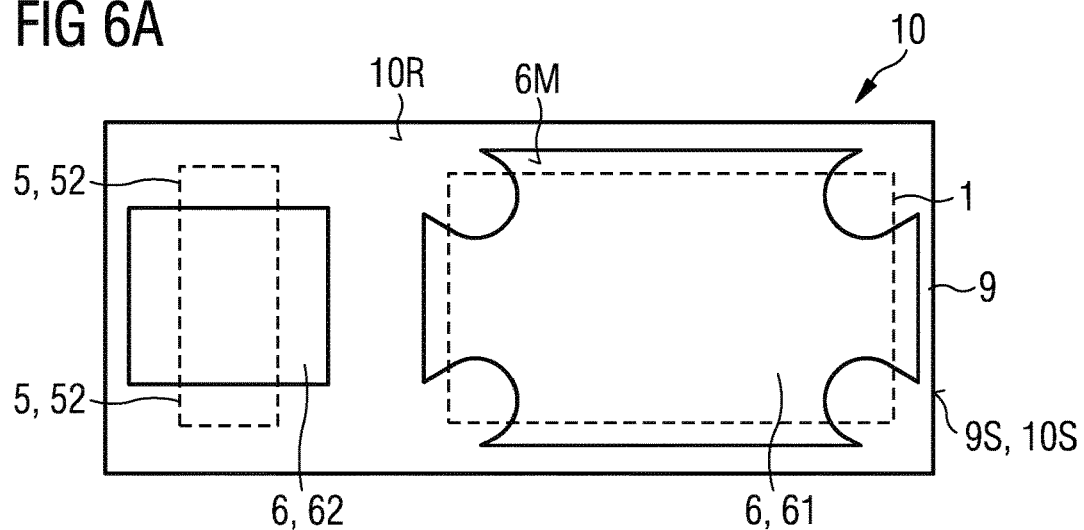
Figure 6B:
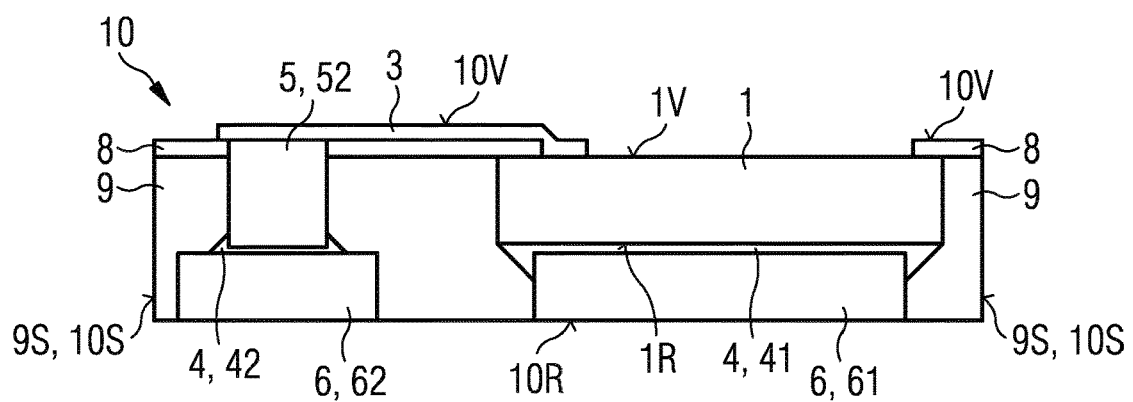
Figure 6C:
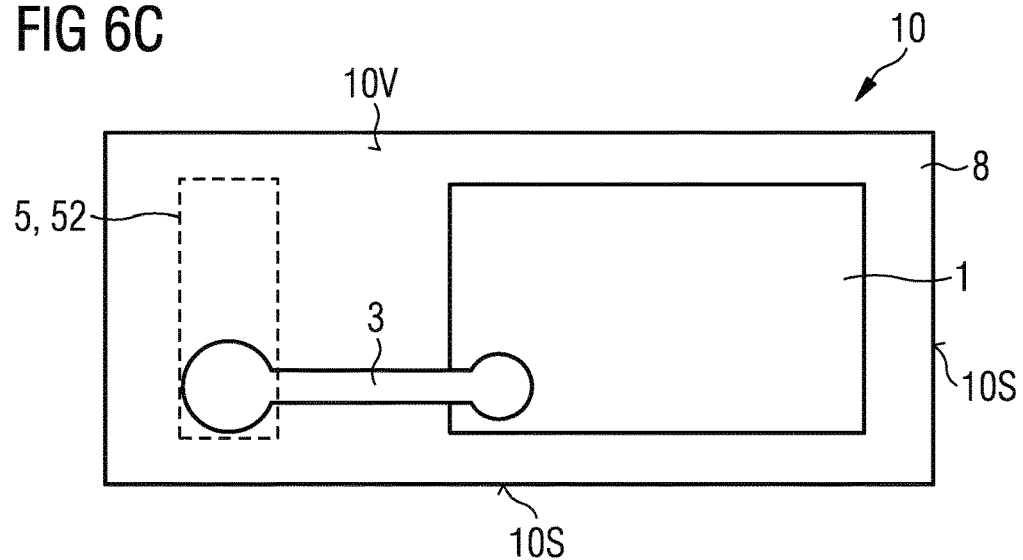

The exemplary embodiment of a device 10 as represented in FIGS. 6A, 6B and 6C corresponds substantially to the exemplary embodiment represented in FIGS. 2A, 2B and 2C. As a difference therefrom, the first subregion 61 of the lead frame 6 is structured in such a way that the component 1 protrudes laterally beyond the first subregion 61 only in the corner regions of the first subregion 61. On the side edges, the first subregion 61 may locally protrude laterally beyond the component 1.

As a further difference, the intermediate contact 5 may locally protrude laterally beyond the underlying second subregion 62 of the lead frame 6, in particular on two opposite side edges of the second subregion 62. The second subregion may also locally protrude laterally beyond the intermediate contact 5, for instance on the other two side edges of the intermediate contact 5. As schematically represented in FIGS. 6A and 6B, the intermediate contact 5 and the second subregion 62 may locally have steps which face toward the back side 10R of the device 10 and locally have steps which face toward the front side 10V of the device 10, in order to achieve bilateral anchoring of the molded body.

According to FIGS. 6A and 6B, the intermediate contact 5 may be a passive chip 52 or a passive through-contact 52. Such an intermediate contact 5 may have an ohmic contact as its core, which for example is laterally surrounded by a plastic layer, in particular by a passivation layer. The intermediate contact may, for example, be a PCB/Si through-contact 52 or a plastic/metal through-contact 52 or a metal hybrid through-contact 52.

Figure 7A:
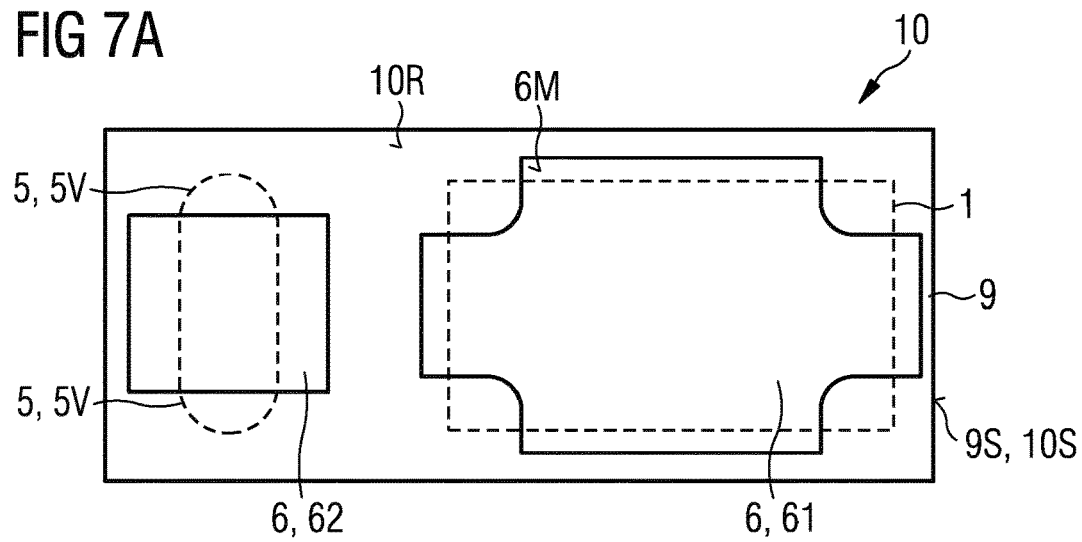
Figure 7B:
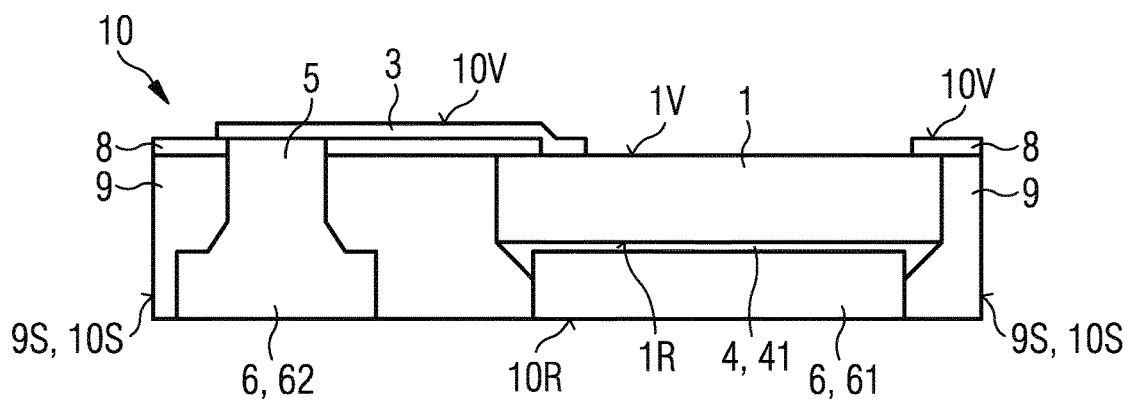
Figure 7C:
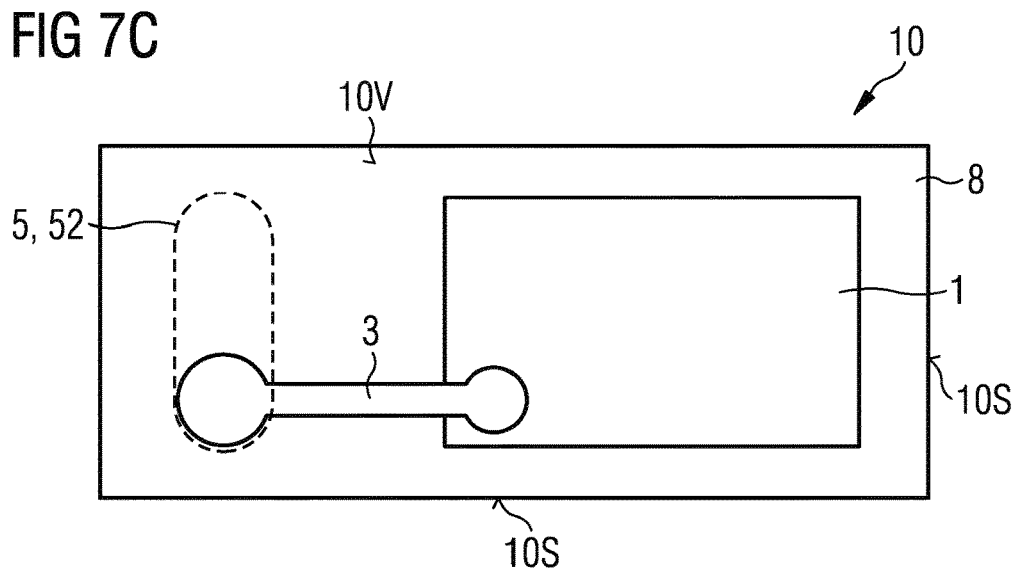

The exemplary embodiment of a device 10 as represented in FIGS. 7A, 7B and 7C corresponds substantially to the exemplary embodiment represented in FIGS. 6A, 6B and 6C. Unlike in FIGS. 6A, 6B and 6C, in which the intermediate contact 5 is configured rectangularly in plan view, the intermediate contact 5 according to FIGS. 7A, 7B and 7C is configured elliptically in plan view. As a variant thereof, the intermediate contact 5 may have other geometrical shapes.

According to FIGS. 7A, 7B and 7C, the intermediate contact 5 is furthermore configured as part of the second subregion 62 of the lead frame 6. The intermediate contact 5 may, for example, be formed by partial etching of the second subregion 62. In this case, it is possible for the intermediate contact 5 to locally protrude laterally beyond the underlying section of the second subregion 62.

As a further difference from the exemplary embodiment represented in FIGS. 6A, 6B and 6C, in which the structured corner regions of the first subregion 61 are configured as curvilinear indentations, the first subregion 61 according to FIGS. 7A, 7B and 7C has rectangular indentations in the corner regions.

Figure 8A:
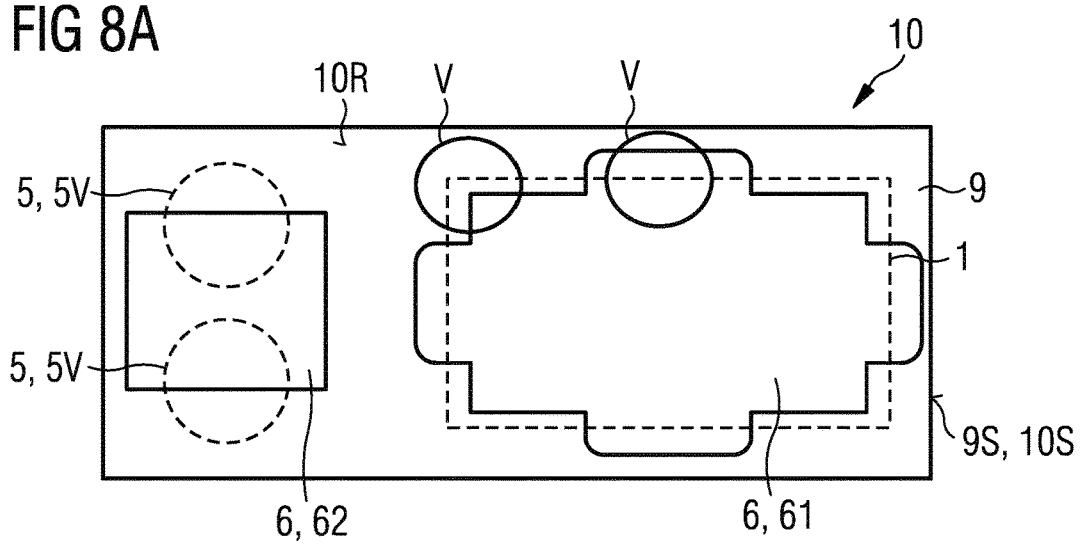
Figure 8B:
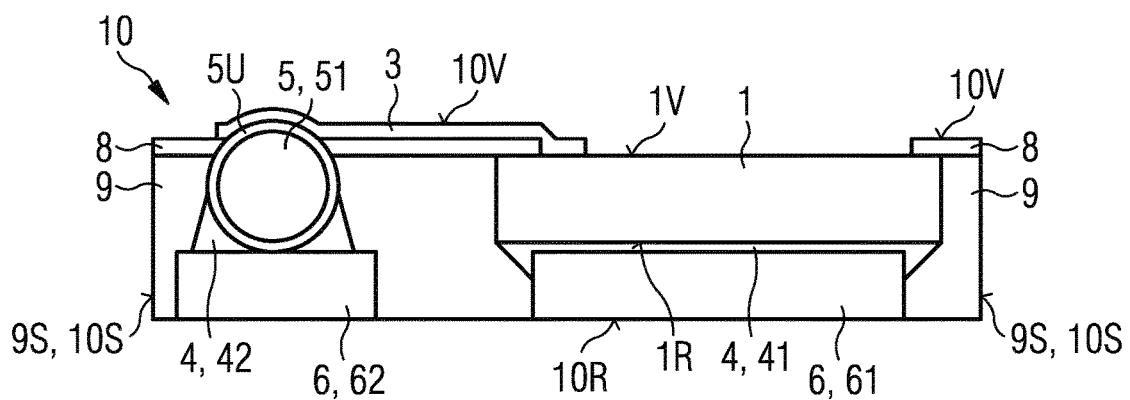
Figure 8C:
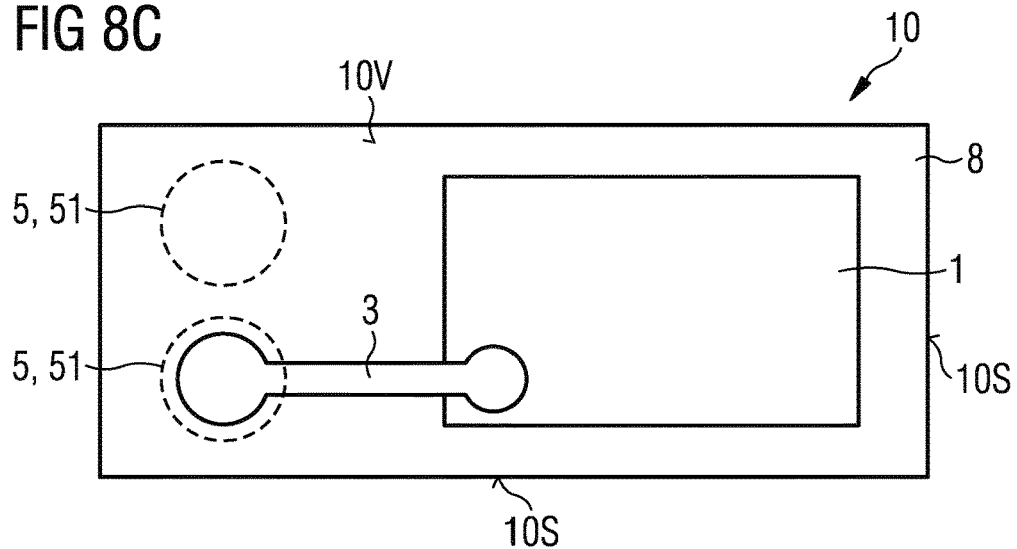

The exemplary embodiment of a device 10 as represented in FIGS. 8A, 8B and 8C corresponds substantially to the exemplary embodiment represented in FIGS. 6A, 6B and 6C. As a difference therefrom, the second subregion 62 and the intermediate contacts 5 are similar to the exemplary embodiment represented in FIGS. 5A, 5B and 5C. Furthermore, the first subregion 61 is structured in the corner regions in such a way that each corner region is removed in an L-shaped fashion. On the side edges, the first subregion 61 has local lateral projections, which in plan view protrude beyond the component 1.

The exemplary embodiment of a device 10 as represented in FIGS. 9A, 9B and 9C corresponds substantially to the exemplary embodiment represented in FIGS. 8A, 8B and 8C. As a difference therefrom, the side edges or side faces of the first subregion 61 are structured in such a way that the first subregion 61 protrudes laterally beyond the component 1 exclusively in the corner regions. In other words, the first subregion 61 in plan view has projections in its corner regions. On the side edges or the side faces of the first subregion 61, the component 1 protrudes laterally beyond the first subregion 61.

Figure 10A:
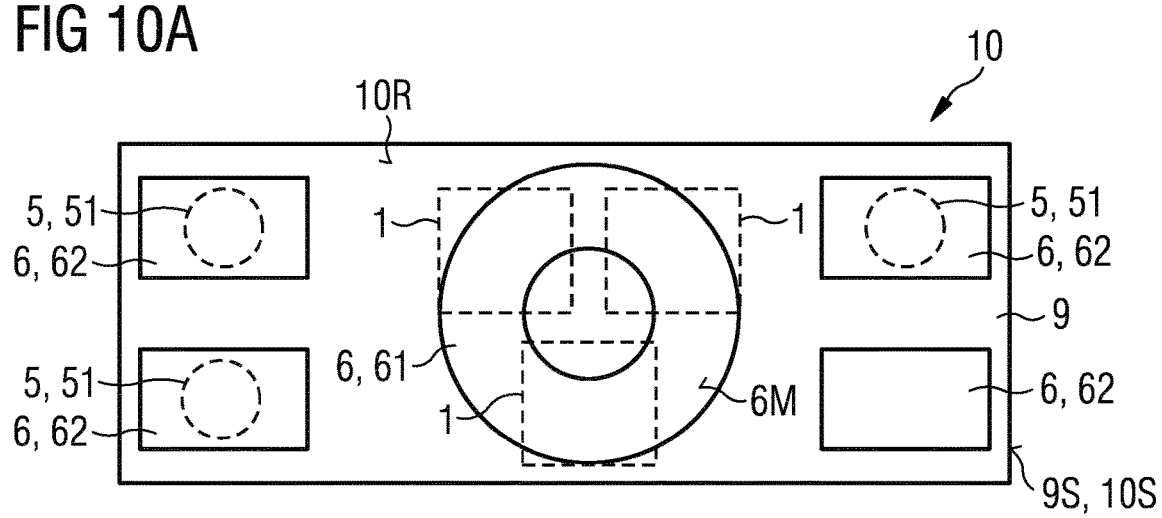
Figure 10B:
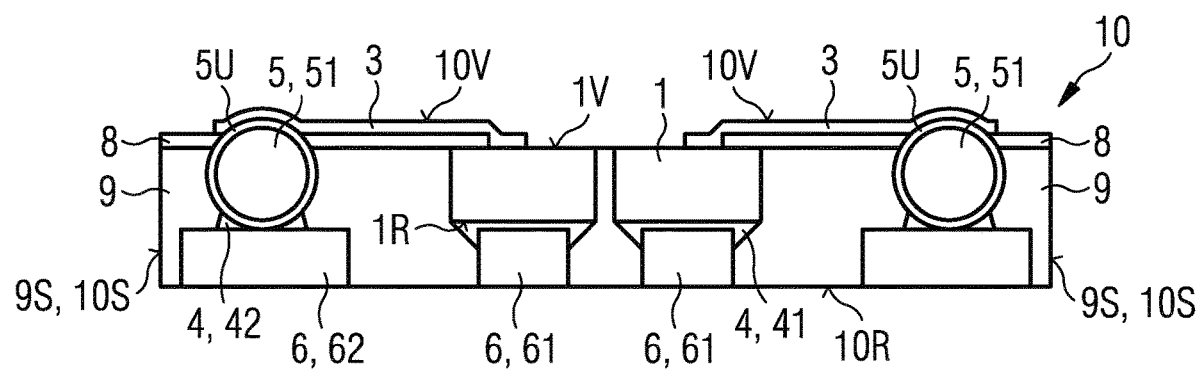
Figure 10C:
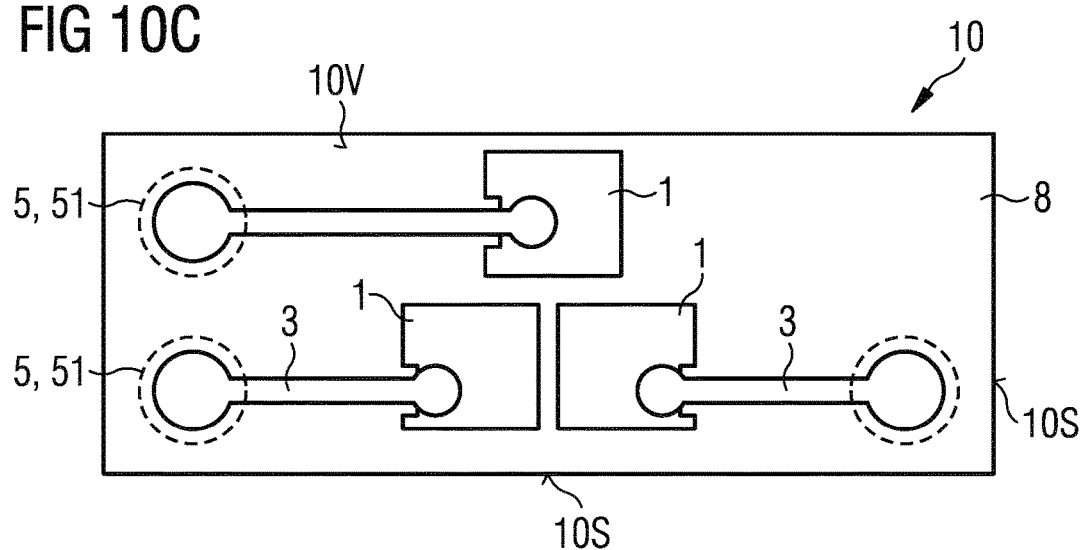

The exemplary embodiment of a device 10 as represented in FIGS. 10A, 10B and 10C corresponds substantially to the exemplary embodiment represented in FIGS. 4A, 4B and 4C. As a difference therefrom, the device 10 has a multiplicity of components 1. The components 1 are, in particular, arranged on a common first subregion 61 and respectively locally protrude laterally beyond the common first subregion 61. In particular, the first subregion 61 has the shape of a torus. In plan view, the first subregion 61 therefore has a continuous surface with an inner opening. The components 1 may partially cover the inner opening in plan view.

The device 10 according to FIGS. 10A, 10B and 10C has a multiplicity of planar contact structures 3, which respectively are electrically conductively connected to one of the second subregions 62 of the lead frame 6. By means of the individual subregions 62, the components 1 may be driven together or independently of one another.

The exemplary embodiment of a device 10 as represented in FIGS. 11A, 11B and 11C corresponds substantially to the exemplary embodiment represented in FIGS. 2A, 2B and 2C. As a difference therefrom, the first subregion 61 and/or the second subregion 62 may end flush with at least one of the side faces 9S of the molded body 9. The side faces 10S of the device 10 may be formed locally by side faces 9S of the molded body 9 and locally by side faces of the first subregion 61 and/or of the second subregion 62.

According to FIGS. 11A and 11C, the subregions 61 and 62 have exposed surfaces on at least one side face 10S or on a plurality of side faces 10S of the device 10. These exposed surfaces may have cutting traces of an individualization process. According to FIG. 11C, the exposed surface of the first subregion 61 or of the second subregion 62 extends along the vertical direction from the back side 10R of the device 10 to a central region of the respective side face 10S of the device 10, the central region being separated from a front side of the molded body 9. Unlike in FIGS. 11A, 11B and 11C, it is possible for the first subregion 61 and/or the second subregion 62 to have exposed surfaces, in particular with cutting traces, on all side faces 10S of the device 10.

Figure 12A:
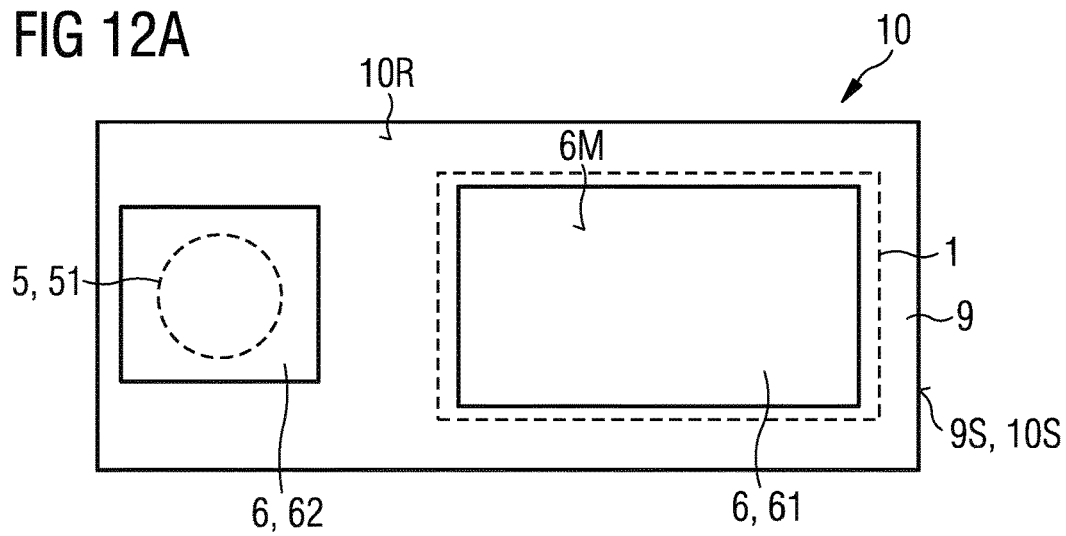
Figure 12B:
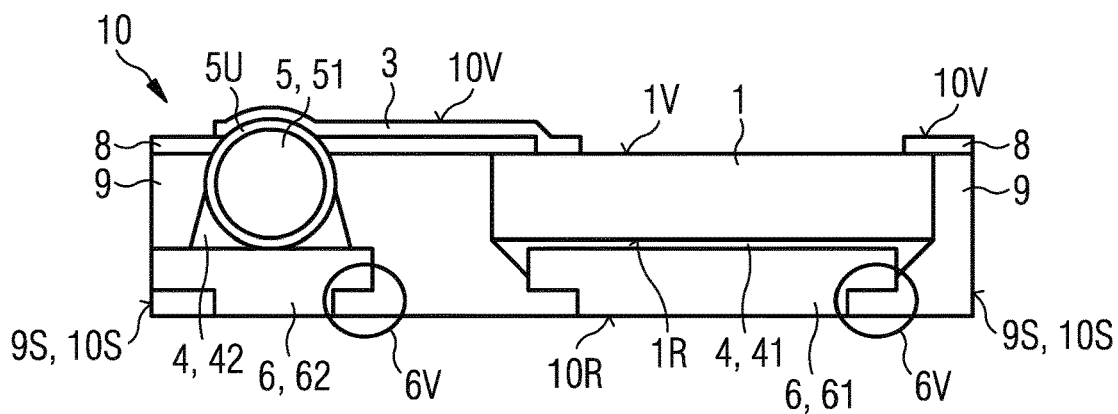
Figure 12C:
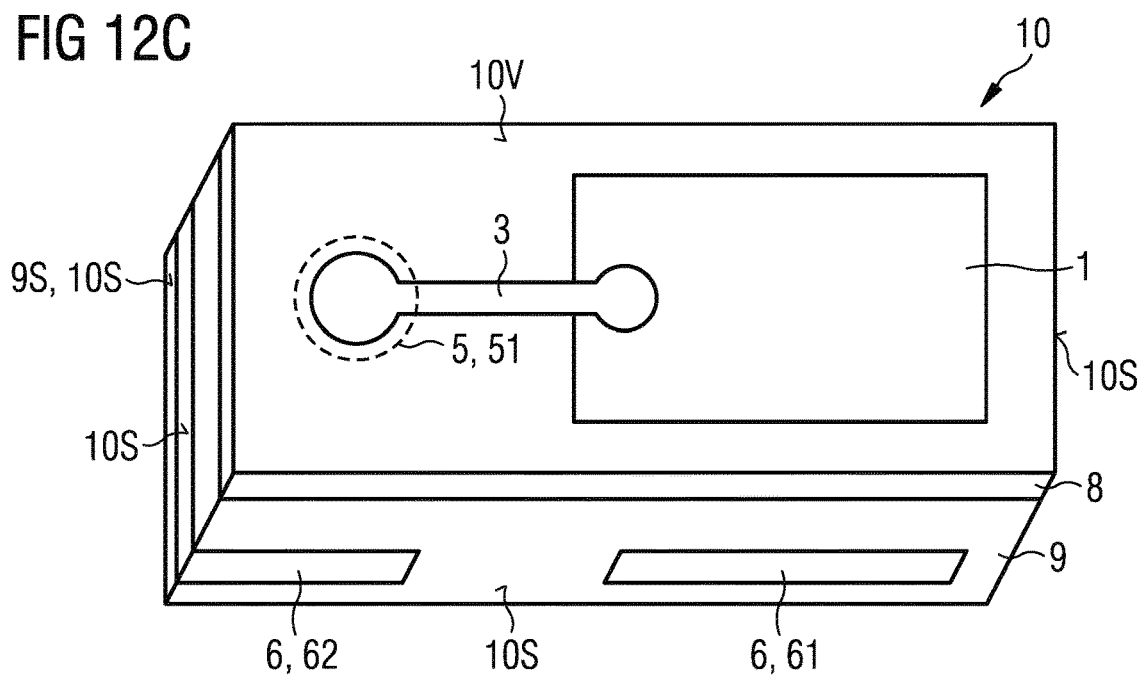

The exemplary embodiment of a device 10 as represented in FIGS. 12A, 12B and 12C corresponds substantially to the exemplary embodiment represented in FIGS. 11A, 11B and 11C. As a difference therefrom, the exposed surfaces of the first subregion 61 and/or of the second subregion 62 are respectively located exclusively in a central region of the respective side faces 10S of the device 10, the central region being separated both from a front side and from a back side of the molded body 9. On the side faces 10S, the respective exposed surface of the first subregion 61 or of the second subregion 62 is therefore spatially separated both from the front side 10V and from the back side 10R of the device (FIG. 12C).

On the back side 10R, the contact pads of the subregions 61 and 62 may furthermore be fully surrounded by the molded body 9 (FIGS. 2A and 12A). As schematically represented in FIG. 12B, the subregions 61 and 62 may have additional anchoring structures 6V in a similar way to the exemplary embodiment represented in FIG. 4B. The exposed surfaces of the subregions 61 and 62 may respectively serve as a solder stop limit. It is also conceivable for the device 10 to be externally electrically contactable via the exposed surfaces of the subregions 61 and 62 on the side faces 10S of the device 10.

A so-called QFN device having a planar contacting structure on a component and a molded body, the molded body being anchored with a lead frame and/or with the component, is generally more economical than a device on a circuit board or on a ceramic substrate. In particular, the use of a partially structured lead frame having a through-contact arranged thereon is more economical than the formation of a subsequently etched through-contact. With the use of through-contacts, particularly in the shape of spheres, the through-contacts may be adhesively bonded or soldered before the application of the molded body on the lead frame, and therefore etched in parallel on the lead frame. This method is more economical than the subsequent introduction of through-contacts, in particular after the formation of the molded body. The QFN device having a planar contacting structure and improved anchoring of the molded body may be configured particularly compactly overall. The better mechanical anchoring, for instance in the manner of a form-fit connection between the molded body and the anchoring structures of the device, furthermore leads to increased reliability and simplified processability of the device or the devices.

This patient application claims the priority of German Patent Application DE 10 2019 119 371.0, the disclosure content of which is incorporated here by reference.

By the description of the invention with the aid of the exemplary embodiments, the invention is not restricted to the latter. Rather, the invention comprises any new feature and any combination of features, which in particular includes any combination of features in the claims, even if this feature or this combination itself is not explicitly specified in the claims or exemplary embodiments.

LIST OF REFERENCES 10 device
10V front side of the device
10R back side of the device
10S side face of the device
1 component
1V front side of the component
1R back side of the component
3 planar contact structure
4 connecting layer
41 first connecting layer
42 second connecting layer
5 intermediate contact/through-contact
5V anchoring structure of the intermediate contact or of the second subregion of the lead frame
51 spherical core of the intermediate contact
52 passive chip/passive through-contact
5U encapsulation of the intermediate contact
6 lead frame
61 first subregion of the lead frame
62 second subregion of the lead frame
6M mounting face
6V anchoring structure of the lead frame
71 first cover layer
72 second cover layer
8 insulation layer
9 molded body
9S side faces of the molded body
V anchoring structure consisting of the overhang of the component beyond the first subregion of the lead frame

The invention claimed is:

1. A device having a component, a lead frame and a molded body, wherein
the component and the lead frame are at least locally enclosed in lateral directions by the molded body, the lead frame not protruding beyond side faces of the molded body,
the lead frame has at least one first subregion including a mounting face being configured with structured corners so that the device in plan view laterally protrudes beyond the mounting face at the structured corners, and at least one second subregion laterally separated from the first subregion, the component being electrically conductively connected by means of a planar contact structure to the second subregion, and
the component is arranged on the first subregion in plan view and laterally protrudes at least locally beyond the first subregion, so that the component and the first subregion form an anchoring structure on which the molded body is anchored with the component and the first subregion.

2. The device as claimed in claim 1, wherein the first subregion is laterally separated from the second subregion by an intermediate region, the component partially covering the intermediate region in plan view and the intermediate region being filled by a material of the molded body.

3. The device as claimed in claim 1, wherein the planar contact structure is located on a front side of the component and the component is electrically conductively connected its back side to the first subregion.

4. The device as claimed in claim 1, wherein the first subregion and the second subregion of the lead frame are formed from a same material and are assigned to different electrical polarities of the device.

5. The device as claimed in claim 1, wherein the lead frame has a smaller vertical height than the molded body, and the planar contact structure is electrically conductively connected by an intermediate contact to the second subregion of the lead frame, the intermediate contact being different to the lead frame and laterally surrounded by the molded body.

6. The device as claimed in claim 5, wherein the intermediate contact is fastened on the second subregion and has a shape of a sphere, so that lateral indentations, on which the molded body is anchored, are formed at transition regions between the intermediate contact and the second subregion.

7. The device as claimed in claim 5, wherein the intermediate contact has a spherical core made of a metal and the spherical core is coated with an electrically conductive encapsulation.

8. The device as claimed in claim 5, wherein the intermediate contact is a passive chip, which is fastened on the second subregion and establishes an electrical connection between the planar contact structure and the second subregion, the molded body being anchored on the passive chip by the passive chip having a lateral indentation or a lateral protuberance, or in plan view locally protruding beyond the second subregion of the lead frame.

9. The device as claimed in claim 1, wherein the second subregion of the lead frame extends along a vertical direction through the molded body and has at least one lateral indentation or lateral protuberance, on which the molded body is anchored.

10. The device as claimed in claim 1, wherein the lead frame ends flush in lateral directions with at least one of the side faces of the molded body.

11. The device as claimed in claim 1, wherein the component has a front side, facing away from the lead frame, which is locally covered by the planar contact structure and by an insulation layer, the planar contact structure and the insulation layer in plan view likewise covering the molded body so that the component is vertically anchored because of coverage by the planar contact structure and by the insulation layer.

12. The device as claimed in claim 1, wherein the first subregion or the second subregion of the lead frame have a first cross section on a back side of the device and a second cross section between the back side and a front side of the device, the first cross section being smaller than the second cross section and transitioning abruptly along a vertical direction into the second cross section, so that side faces of the lead frame have at least one step on which the molded body is anchored.

13. The device as claimed in claim 1, wherein the device in plan view laterally protrudes beyond side lines of the mounting face.

14. The device as claimed in claim 1, which has a plurality of components which are arranged on a common first subregion of the lead frame, the common first subregion having a shape of a torus and the plurality of components in plan view respectively locally protruding laterally beyond the torus.

15. A method for producing at least one device having a component, a lead frame and a molded body, comprising:
providing the lead frame with at least one first subregion including a mounting face being configured with structured corners so that the device in plan view laterally protrudes beyond the mounting face at the structured corners, and at least one second subregion laterally separated from the first subregion;

fastening the component on the first subregion so that the component in plan view laterally protrudes at least locally beyond the first subregion and thus forms an anchoring structure in a form of a step with the first subregion;

forming the molded body, the lead frame being enclosed at least locally by the molded body in lateral directions and not protruding beyond side faces of the molded body, and the molded body being anchored on the anchoring structure with the component and the first subregion; and forming a planar contact structure on the component and on the molded body, the component being electrically conductively connected by means of the planar contact structure to the second subregion.

16. The method as claimed in claim 15, wherein the molded body is applied on and around the lead frame by a casting method or a plastic forming method.

17. The method as claimed in claim 16, wherein the molded body is formed by a film-assisted molding method.

18. The method as claimed in claim 15, wherein a through-contact is fastened on the second subregion of the lead frame before the forming of the molded body, the through-contact being adapted to establish an electrical connection between the second subregion and the planar contact structure and to anchor the molded body.

19. The method as claimed in claim 15, wherein the method is for producing a plurality of devices, wherein a plurality of components are arranged on at least one common first subregion and are overmolded by a common molded body, and the at least one common first subregion and the common molded body are divided in order to individualize the plurality of devices into a plurality of first subregions and a plurality of molded bodies, so that a respective first subregion and a respective molded body of a same device of the plurality of devices end flush at least on one side face of the same device.

* * * * *